United States Patent
Okazawa et al.

(10) Patent No.: US 6,834,018 B2
(45) Date of Patent: Dec. 21, 2004

(54) NONVOLATILE MEMORY DEVICE HAVING DATA READ OPERATION WITH USING REFERENCE CELL AND METHOD THEREOF

(75) Inventors: Takeshi Okazawa, Kanagawa (JP); Shuuichi Tahara, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 146 days.

(21) Appl. No.: 10/291,216

(22) Filed: Nov. 8, 2002

(65) Prior Publication Data

US 2003/0086314 A1 May 8, 2003

(30) Foreign Application Priority Data

Nov. 8, 2001 (JP) .......................................... 2001-343916

(51) Int. Cl.[7] ............................................... G11C 7/02
(52) U.S. Cl. ....................... 365/209; 365/145; 365/158; 365/210
(58) Field of Search ................................ 365/209, 145, 365/158, 218

(56) References Cited

U.S. PATENT DOCUMENTS

| | | | |
|---|---|---|---|
| 4,202,046 A | 5/1980 | Ward | |
| 6,002,625 A | 12/1999 | Ahn | |
| 6,191,972 B1 | 2/2001 | Miura et al. | |
| 6,278,631 B1 * | 8/2001 | Naji | 365/158 |
| 6,317,376 B1 * | 11/2001 | Tran et al. | 365/210 |

* cited by examiner

Primary Examiner—Hoai Ho
(74) Attorney, Agent, or Firm—Katten Muchin Zavis Rosenman

(57) ABSTRACT

A semiconductor memory device as claimed in the present invention has a reference cell, a first memory cell, a second memory cell located nearer the first memory cell than the reference cell and a data read circuit provided therein. The data read circuit identifies first data stored in the first memory cell based on a reference cell electrical state of the reference cell and a first electrical state of the first memory cell. Furthermore, the data read circuit identifies second data stored in the second memory cell based on the first electrical state of the first memory cell and a second electrical state of the second memory cell. The semiconductor memory device having such configuration is able to suppress influence of variation in electrical performance of memory cell and stably identify data stored in a memory cell.

20 Claims, 13 Drawing Sheets

NONVOLATILE MEMORY DEVICE HAVING DATA READ OPERATION WITH USING REFERENCE CELL AND METHOD THEREOF

BACKGROUND OF THE INVENTION

1. Field of the Invention

The present invention relates to a nonvolatile memory device, in particularly to a magnetic random access memory (MRAM) device on which a data read operation is performed referring to a reference cell.

2. Description of a Related Art

In some cases, operation for reading data stored in a memory cell of a semiconductor memory device such as MRAM (Magnetic Random Access Memory) and FRAM (Ferroelectric Random Access Memory) is performed referring to a reference cell. For example, in the case of MRAM, the amount of current read from a memory cell and the amount of current read from a reference cell are compared to one another to identify data stored in the memory cell. Furthermore, in the case of FRAM, a voltage appearing on a reference bit line when a reference cell is connected to the reference bit line and a voltage appearing on a bit line when a memory cell is connected to the bit line are compared to one another to identify data stored in the memory cell.

FIG. 11 illustrates a memory cell array 101 of a MRAM of a related art. The memory cell array 101 includes word lines $W_1$ to $W_m$ (m: natural number, m>1) and bit lines $B_1$ to $B_n$. (n: natural number, n>1) At individual positions at which the word lines $W_1$ to $W_m$ and the bit lines $B_1$ to $B_n$ intersect one another are disposed memory cells. The memory cell disposed at the position at which, the word line $W_i$ and the bit line $B_j$ intersect one another is denoted by a memory cell "$C_{ij}$."

FIG. 12 illustrates the structure of the memory cell $C_{ij}$. The memory cell $C_{ij}$ includes a fixed layer 111, a data storage layer 112 and a tunnel insulation film 113. The fixed layer 111 is connected to the word line $W_i$ and the data storage layer 112 is connected to the bit line $B_j$. Both the fixed layer 111 and the data storage layer 112 consist of a ferromagnetic material and respectively have a spontaneous magnetization. The tunnel insulation film 113 is disposed between the fixed layer 111 and the data storage layer 112, and formed to have a film thickness for allowing tunnel current to flow between the fixed layer 111 and the data storage layer 112. The film thickness of the tunnel insulation film 113 is typically 1.5 nm.

As shown in FIG. 13, the memory cell $C_{ij}$ stores data "0" or data "1" therein depending on directions of spontaneous magnetizations of the fixed layer 111 and the data storage layer 112. The direction of the spontaneous magnetization of the fixed layer 111 is being fixed. The direction of the spontaneous magnetization of the data storage layer 112 can freely be inverted and coincides with one of two directions, i.e., the same direction as that of the spontaneous magnetization of the fixed layer 111 and the direction reverse to that of the spontaneous magnetization thereof. When the directions of spontaneous magnetizations of the fixed layer 111 and the data storage layer 112 coincide with each other, the spontaneous magnetizations of the fixed layer 111 and the data storage layer 112 are denoted as "parallel" and when the directions of spontaneous magnetizations of the fixed layer 111 and the data storage layer 112 are opposite each other, the spontaneous magnetizations of the fixed layer 111 and the data storage layer 112 are denoted as "anti-parallel." The memory cell $C_{ij}$ has one of "parallel" state indicating the directions of spontaneous magnetizations of the fixed layer 111 and the data storage layer 112 are parallel to each other and "anti-parallel" state indicating the directions thereof are opposite each other, and an electrical state corresponding to the "parallel" state indicating the directions of spontaneous magnetizations of the fixed layer 111 and the data storage layer 112 are parallel to each other is made to correspond to one of data "0" and data "1," and an electrical state corresponding to the "anti-parallel" state indicating the directions thereof are opposite each other is made to correspond to the other of data "0" and data "1." Hereinafter, explanation will be made assuming that an electrical state corresponding to the "parallel" state indicating the directions of spontaneous magnetizations of the fixed layer 111 and the data storage layer 112 are parallel to each other corresponds to data "1," and an electrical state corresponding to the "anti-parallel" state indicating the directions thereof are opposite each other corresponds to data "0."

Data stored in the memory cell $C_{ij}$ is identified utilizing a change of resistance value of the tunnel insulation film 113 due to tunnel magneto-resistance effect (TMR effect). The resistance of the tunnel insulation film 113 varies depending on the states, i.e., the "parallel" state indicating the directions of spontaneous magnetizations of the fixed layer 111 and the data storage layer 112 are parallel to each other, and the "anti-parallel" state indicating the directions thereof are opposite each other. That is, the first resistance of the tunnel insulation film 113 when the spontaneous magnetizations of the fixed layer 111 and the data storage layer 112 are in the "anti-parallel" state is larger than the second resistance thereof when the spontaneous magnetizations of the fixed layer 111 and the data storage layer 112 are in the "parallel" state by 10 to 40% of the second resistance. Thus, data stored in the memory cell $C_{ij}$ is identified utilizing a difference in resistance of the tunnel insulation film 113.

Data stored in the memory cell $C_{ij}$ is read based on current flowing between the word line $W_i$ and the bit line $B_j$. When the data stored in the memory cell $C_{ij}$ is read, a specific potential difference is applied between the word line $W_i$ and the bit line $B_j$. The amount of current flowing between the word line $W_i$ and the bit line $B_j$ by applying the specific potential difference therebetween varies depending on the resistance of the tunnel insulation film 113. Since the resistance of the tunnel insulation film 113 varies depending on the states corresponding to the directions of spontaneous magnetizations of the fixed layer 111 and the data storage layer 112, the data stored in the memory cell $C_{ij}$ can be identified based on current flowing between the word line $W_i$ and the bit line $B_j$.

In this case, the data stored in the memory cell $C_{ij}$ can be identified referring to a reference cell that has a structure similar to that of a memory cell. As shown in FIG. 11, the memory cell array 101 has reference cells $R_1$ to $R_m$ provided therein, each of which includes previously determined data written thereinto. The reference cells $R_1$ to $R_m$ all are connected to a reference bit line $B_r$. The reference cells $R_1$ to $R_m$ are connected respectively to word lines $W_1$ to $W_m$. Data stored in memory cells $C_{i1}$ to $C_{in}$, which are connected to the word line $W_i$, is read referring to the reference cell $R_i$.

The reference cells $R_1$ to $R_m$ are designed so that current I(Ref) flowing through each of the reference cells $R_1$ to $R_m$ satisfies the following equation.

$$I(1) > I(Ref) > I(0) \quad (1)$$

I(0): current flowing through a memory cell storing data "0"

I(1): current flowing through a memory cell storing data "1"

The data stored in the memory cell $C_{ij}$ is identified by comparing current flowing through the memory cell $C_{ij}$ and the current flowing through the reference cell $R_i$ with each other. When the memory cell $C_{ij}$ is identified, a specific potential difference is applied between the word line $W_i$ and the reference bit line $B_r$ to pass current through the reference cell $R_i$. Furthermore, a specific voltage is applied between the word line $W_i$ and the bit line $B_j$ to pass current through the memory cell $C_{ij}$. Furthermore, a specific potential difference is applied between the word line $W_i$ and the bit line $B_j$ to pass current through the memory cell $C_{ij}$. The amount of current having flowed through the memory cell $C_{ij}$ and the amount of current having flowed through the reference cell $R_i$ are compared with each other, and when the amount of current having flowed through the memory cell $C_{ij}$ is larger than that of current having flowed through the reference cell $R_i$, the data stored in the memory cell $C_{ij}$ is identified as "1," and when the amount of current having flowed through the memory cell $C_{ij}$ is smaller than that of current having flowed through the reference cell $R_i$, the data stored in the memory cell $C_{ij}$ is identified as "0."

In the semiconductor memory device constructed as described above, a memory cell exhibiting variation in its electrical performance adversely affects operation for stably identifying data stored in a memory cell. When a memory cell exhibits larger variation in its electrical performance, a differential amount between currents flowing respectively through a memory cell and a reference cell, which amount can be used to identify data stored in a memory cell, becomes smaller. In order to address problems caused by such unfavorable decrease in the differential amount, a designer has to design circuits associated with a reference cell and an identification of data with high accuracy or to design the circuits associated therewith at the expense of access speed at which a reading operation is performed.

SUMMARY OF THE INVENTION

An object of the present invention is to provide a magnetic memory device capable of suppressing influence of variation in electrical performance of memory cell and stably identifying data stored in the memory cell.

Another object of the present invention is to provide a magnetic memory device having a capability to suppress influence of variation in electrical performance of memory cell and stably identify data stored in a memory cell, and further occupying a small area.

A magnetic memory device as claimed in the present invention includes a reference cell, a first memory cell, a second memory cell located nearer the first memory cell than the reference cell and a data read circuit provided therein. The data read circuit identifies first data stored in the first memory cell based on a reference cell electrical state of the reference cell and a first electrical state of the first memory cell. Furthermore, the data read circuit identifies second data stored in the second memory cell based on the first electrical state of the first memory cell and a second electrical state of the second memory cell.

In the magnetic memory device, the second data stored in the second memory cell is identified by referring to the first memory cell located nearer the second memory cell than the reference cell, whereby a degree to which variation in electrical performance of memory cell affects stability to identify data is suppressed. In general, regarding two memory cells, variation in electrical performance of memory cell due to the process variation in the manufacture of semiconductor memory device becomes smaller when a distance between the two memory cells becomes shorter. Accordingly, in many cases, a degree to which electrical performances of the second memory cell and the first memory cell differs from each other is smaller than that to which electrical performances of the second memory cell and the reference cell differs from each other. In the magnetic memory device, the second data stored in the second memory cell is identified by referring to the first memory cell because it is believed that in many cases, a degree to which electrical performance of the first memory cell differs from that of the second memory cell is smaller than a degree to which electrical performance of the reference cell differs from that of the second memory cell. Accordingly, this operation makes stability to identify data stored in an associated memory cell enhanced.

The data read circuit preferably includes a first comparator for outputting a first comparison result signal indicating whether reference cell storage data stored in the reference cell and the first data stored in the first memory cell coincide with each other or are different from each other based on the reference cell electrical state and the first electrical state, a first data reproduction circuit for reproducing the first data based on the reference cell storage data and the first comparison result signal, a second comparator for outputting a second comparison result signal indicating whether the first data and the second data coincide with each other or are different from each other based on the first electrical state and the second electrical state, and a second data reproduction circuit for reproducing the second data stored in the second memory cell based on the first data and the second comparison result signal.

The above-described semiconductor memory device becomes particularly preferable when the semiconductor memory device is constructed such that each of the reference cell, the first memory cell and the second memory cell includes a tunnel magneto-resistance effect element comprising a first ferromagnetic thin film layer, a second ferromagnetic thin film layer and a tunnel insulation film interposed between the first ferromagnetic thin film layer and the second ferromagnetic thin film layer. The reference cell and the memory cell each consisting of a tunnel magneto-resistance effect element are apt to exhibit variation due to the process variation in the manufacture of semiconductor memory device. The semiconductor memory device constructed as described above exhibits its effectiveness to the fullest extent when the configuration thereof is applied to a semiconductor memory device comprising a reference cell and a memory cell each consisting of a tunnel magneto-resistance effect element.

In addition, above-described semiconductor memory device becomes particularly preferable when the semiconductor memory device is constructed such that each of the reference cell, the first memory cell and the second memory cell includes a MOS transistor having a floating gate therein. The reference cell and the memory cell each consisting of a MOS transistor having a floating gate therein are apt to exhibit variation due to the process variation in the manufacture of semiconductor memory device. The semiconductor memory device constructed as described above exhibits its effectiveness to the fullest extent when the configuration thereof is applied to a semiconductor memory device comprising the reference cell, the first memory cell and the second memory cell each consisting of a MOS transistor having a floating gate therein.

Preferably, the above-described semiconductor memory device further comprises one signal line, in which each of the reference cell, the first memory cell and the second memory cell is enabled by the one signal line.

The above-described semiconductor memory device may comprise a third memory cell and a fourth memory cell located nearer the third memory cell than the reference cell. In this case, preferably, the data read circuit identifies third data stored in the third memory cell based on the reference cell electrical state and a third electrical state of the third memory cell, and further, identifies fourth data stored in the fourth memory cell based on the third electrical state and a fourth electrical state of the fourth memory cell. In the semiconductor memory device constructed as described above, both the first data stored in the first memory cell and the third data stored in the third memory cell are identified by referring to the one reference cell, meaning that plural memory cells share the one reference cell to be referred when a read operation is performed on the plural memory cells. Since the reference cell to be referred is shared by plural memory cells, the semiconductor memory device configured to have such a reference cell provided therein is able to reduce its area.

In this case, the semiconductor memory device further comprises a first signal line, a second signal line and a third signal line, in which preferably, the reference cell is enabled by the first signal line, the first memory cell and the second memory cell are enabled by the second signal line, and the third memory cell and the fourth memory cell are enabled by the third signal line.

The semiconductor memory device as claimed in the present invention comprises a memory cell array having there in a plurality of memory cells disposed in a matrix, a reference cell column having therein a plurality of reference cells disposed in a column and a data read circuit. The data read circuit is provided for identifying first data stored in a first memory cell included in the plurality of memory cells and located on an outermost periphery of the memory cell array based on a reference cell electrical state of a nearest reference cell included in the plurality of reference cells and located nearest the first memory cell, and a first electrical state of the first memory cell, and further identifying second data stored in a second memory cell included in the plurality of memory cells and located adjacent to the first memory cell based on the first electrical state and a second electrical state of the second memory cell. In the above-described semiconductor memory device, a read operation is performed on the second memory cell by referring to the first memory cell because it is believed that in many cases, a degree to which electrical performance of the first memory cell differs from that of the second memory cell is smaller than a degree to which electrical performance of the reference cell differs from that of the second memory cell. Accordingly, stability to identify data stored in the second memory cell is enhanced. Moreover, a distance between the first memory cell and the reference cell is minimized, enhancing stability to identify data stored in the first memory cell.

Preferably, the nearest reference cell, the first memory cell and the second memory cell are enabled by the one signal line.

The semiconductor memory device as claimed in the present invention comprises a memory cell array having there in a plurality of memory cells disposed in a matrix, a reference cell and a data read circuit. The data read circuit is provided for identifying first data stored in a first memory cell included in the plurality of memory cells and located on an outermost periphery of the memory cell array based on a reference cell electrical state of the reference cell and first electrical state of the first memory cell, and identifying second data stored in a second memory cell included in the plurality of memory cells and located adjacent to the first memory cell based on the first electrical state and a second electrical state of the second memory cell, and then, identifying third data stored in a third memory cell included in the plurality of memory cells and located on an outermost periphery of the memory cell array, the third memory cell being different from the first memory cell, based on the reference cell electrical state and a third electrical state of the third memory cell, and further, identifying fourth data stored in fourth memory cell included in the plurality of memory cells and located adjacent to the third memory cell based on the third electrical state and a fourth electrical state of the fourth memory cell.

A method of reading data from a semiconductor memory device as claimed in the present invention comprises: identifying first data stored in a first memory cell based on a reference cell electrical state of a reference cell and a first electrical state of the first memory cell; and identifying second data stored in a second memory cell located nearer the first memory cell than the reference cell based on the first electrical state and a second electrical state of the second memory cell.

In this case, preferably, the step includes: producing a first comparison result signal indicating whether reference cell storage data stored in the reference cell and the first data stored in the first memory cell coincide with each other or are different from each other based on the reference cell electrical state and the first electrical state; and reproducing the first data based on the reference cell storage data and the first comparison result signal, and the step includes: outputting a second comparison result signal indicating whether the first data stored in the first memory cell and the second data stored in the second memory cell coincide with each other or are different from each other based on the first electrical state and the second electrical state; and reproducing the second data based on the first data and the second comparison result signal.

A method of reading data from a semiconductor memory device as claimed in the present invention is applied to a semiconductor memory device comprising a plurality of row lines extending in a first direction, a plurality of column lines extending in a direction different from the first direction, a plurality of memory cells each being provided at intersections at which the plurality of row lines and the plurality of column lines intersect one another and each being comprised of two ferromagnetic thin film layers interposing an insulation film therebetween, a reference column line provided adjacent to an outermost column line out of the plurality of column lines and intersecting the plurality of row lines, and a plurality of reference elements each being provided at intersections at which the reference column line and the plurality of row lines intersect one another. The method of reading data from the semiconductor memory device constructed as described above comprises: optionally selecting one row line out of the plurality of row lines; comparing the reference element in the one row line being selected and a first memory cell in the one row line being selected with each other; and comparing the first memory cell in the one row line being selected and a second memory cell in the one row line being selected with each other.

A method of reading data from a semiconductor memory device as claimed in the present invention is applied to a semiconductor memory device comprising: at least one row line; first and second column lines respectively intersecting the at least one row line; first and second non-volatile memory cells each being provided at intersections at which the at least one row line and the first and second column lines intersect one another; at least one reference column line intersecting the at least one row line; and at least one reference cell provided in the at least reference column line. The method comprises: selecting a first memory cell and the reference cell; identifying data written into the first memory cell by comparing a current flowing through the first column line based on data written into the first memory cell and a current flowing through the at least one reference column line based on data stored in the reference cell with each other; selecting the first memory cell and the second memory cell; comparing a current flowing through the second column line based on data written into the second memory cell and a current flowing through the first row line based on data written into the first memory cell with each other; and identifying data written into the second memory cell based on a comparison result obtained by comparing said two currents used to identify data written into the second memory cell and a result obtained by identifying data written into the first memory cell.

Particularly, the method of reading data from a semiconductor memory device is preferably employed to perform a read operation on a semiconductor memory device in which each of the first and second memory cells and the reference cell includes two ferromagnetic thin film layers interposing an insulation film therebetween.

Furthermore, in order to more securely identify data stored in a memory cell, preferably, the reference cell is disposed adjacent to the first memory cell and the first memory cell is disposed adjacent to the second memory cell.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS (First Embodiment)

Figure 1:
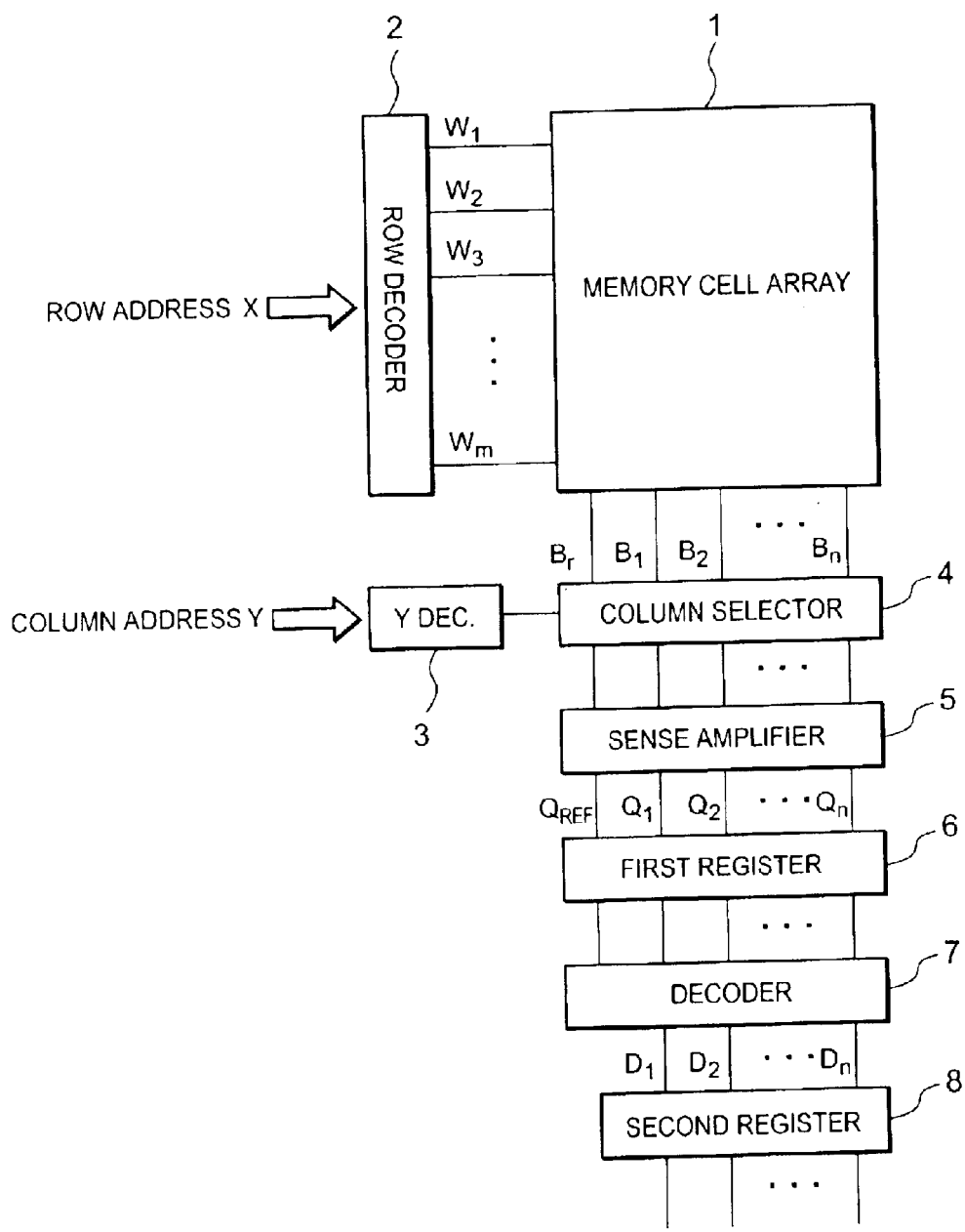
FIG. 1 illustrates a semiconductor memory device of a first embodiment constructed in accordance with the present invention.
Figure 2:
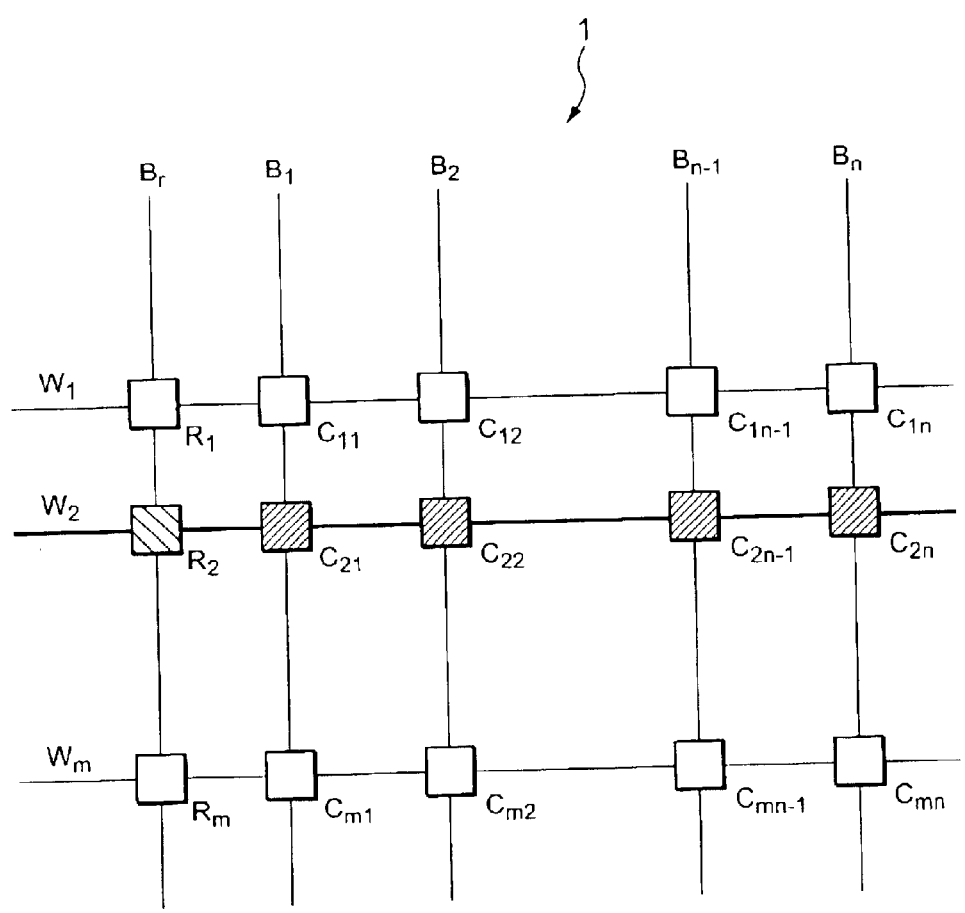
FIG. 2 illustrates a memory cell array 1.

A first embodiment of a semiconductor memory device constructed in accordance with the present invention is an MRAM. As shown in FIG. 1, the MRAM includes a memory cell array 1. As shown in FIG. 2, within the memory cell array 1 are extended word lines $W_1$ to $W_m$ and bit lines $B_1$ to $B_n$. One memory cell is provided at each of the intersections at which the word lines $W_1$ to $W_m$ and the bit lines $B_1$ to $B_n$ intersect one another, and a memory cell $C_{ij}$ is provided at the intersection at which the word line $W_i$ and the bit line $B_j$ intersect one another. The structure of the memory cell $C_{ij}$ is the same as that explained referring to FIG. 12 in the description of the conventional technique, the detailed explanation thereof is omitted.

The memory cell array 1 further has reference cells $R_1$ to $R_m$ provided therein. The reference cells $R_1$ to $R_m$ are connected to a reference bit line $B_r$ provided adjacent to the bit line $B_1$ and extended within the memory cell array 1. The reference cell $R_i$ out of the reference cells $R_1$ to $R_m$ is provided at the intersection at which the word line $W_i$ and the reference bit line $B_r$ intersect one another. The reference cells $R_1$ to $R_m$ each previously have specific data "1" written thereinto and are referred when identifying data stored in the memory cells $C_{11}$ to $C_{mn}$.

As shown in FIG. 1, to the memory cell array 1 is connected a word line decoder 2 for enabling the word lines $W_1$ to $W_m$. To the word line decoder 2 is given a row address X. The word line decoder 2 enables a word line out of the word lines $W_1$ to $W_m$ corresponding to the given row address X.

Furthermore, to the memory cell array 1 are connected a bit line decoder 3, a bit line selector 4 and a sense amplifier 5. To the bit line decoder 3 is given a column address Y. The bit line decoder 3 activates the bit line selector 4 to connect a bit line out of the bit lines $B_1$ to $B_n$ corresponding to the column address Y to the sense amplifier 5.

The sense amplifier 5 compares currents flowing through adjacent two bit lines out of the reference bit line $B_r$ and the bit lines $B_1$ to $B_n$ with each other to output n pieces of comparison result bits $Q_1$ to $Q_n$ indicating the result obtained by the comparison. When the word line $W_i$ out of the word lines $W_1$ to $W_m$ is enabled, current flows through the reference cell $R_i$ to the reference bit line $B_r$ and currents flow through the memory cells $C_{i1}$ to $C_{in}$ to the corresponding bit lines $B_1$ to $B_n$. The sense amplifier 5 compares currents flowing respectively through the reference bit line $B_r$ and the bit line $B_1$ with each other to output the comparison result bit $Q_1$ indicating the result obtained by the comparison. Subsequently, the sense amplifier 5 compares currents flowing respectively through the reference bit line $B_1$ and the bit line $B_2$ with each other to output the comparison result bit $Q_2$ indicating the result obtained by the comparison. Similarly, the sense amplifier 5 compares currents flowing respectively through the reference bit line $B_{(k-1)}$ (k represents integer not less than 2 and not greater than n) and the bit line $B_k$ with each other to output the comparison result bit $Q_k$ indicating the result obtained by the comparison.

The comparison result bits $Q_1$ to $Q_n$ correspond one for one with data stored in the memory cells $C_{i1}$ to $C_{in}$ out of the memory cells $C_{11}$ to $C_{mn}$, the memory cells $C_{i1}$ to $C_{in}$ being connected to the enabled word line $W_i$, but do not coincide with the data itself stored in the memory cells $C_{i1}$ to $C_{in}$. A first register 6, a decoder 7 and a second register 8 are provided for reproducing the data stored in the memory cells $C_{11}$ to $C_{mn}$ based on the comparison result bits $Q_1$ to $Q_n$.

The first register 6 receives the comparison result bits $Q_1$ to $Q_n$ from the sense amplifier 5 to store the same therein. The first register 6 is connected to the decoder 7.

The decoder 7 decodes the comparison result bits $Q_1$ to $Q_n$ stored in the first register 6 to reproduce data $D_1$ to $D_n$ stored in the memory cells $C_{i1}$ to $C_{in}$ and outputs the data $D_1$ to $D_n$ to the second register 8.

The second register 8 receives the data $D_1$ to $D_n$ from the decoder 7 to store the same therein. The second register 8 outputs the data $D_1$ to $D_n$ stored in the memory cells $C_{i1}$ to $C_{in}$ to the outside.

Figure 3:
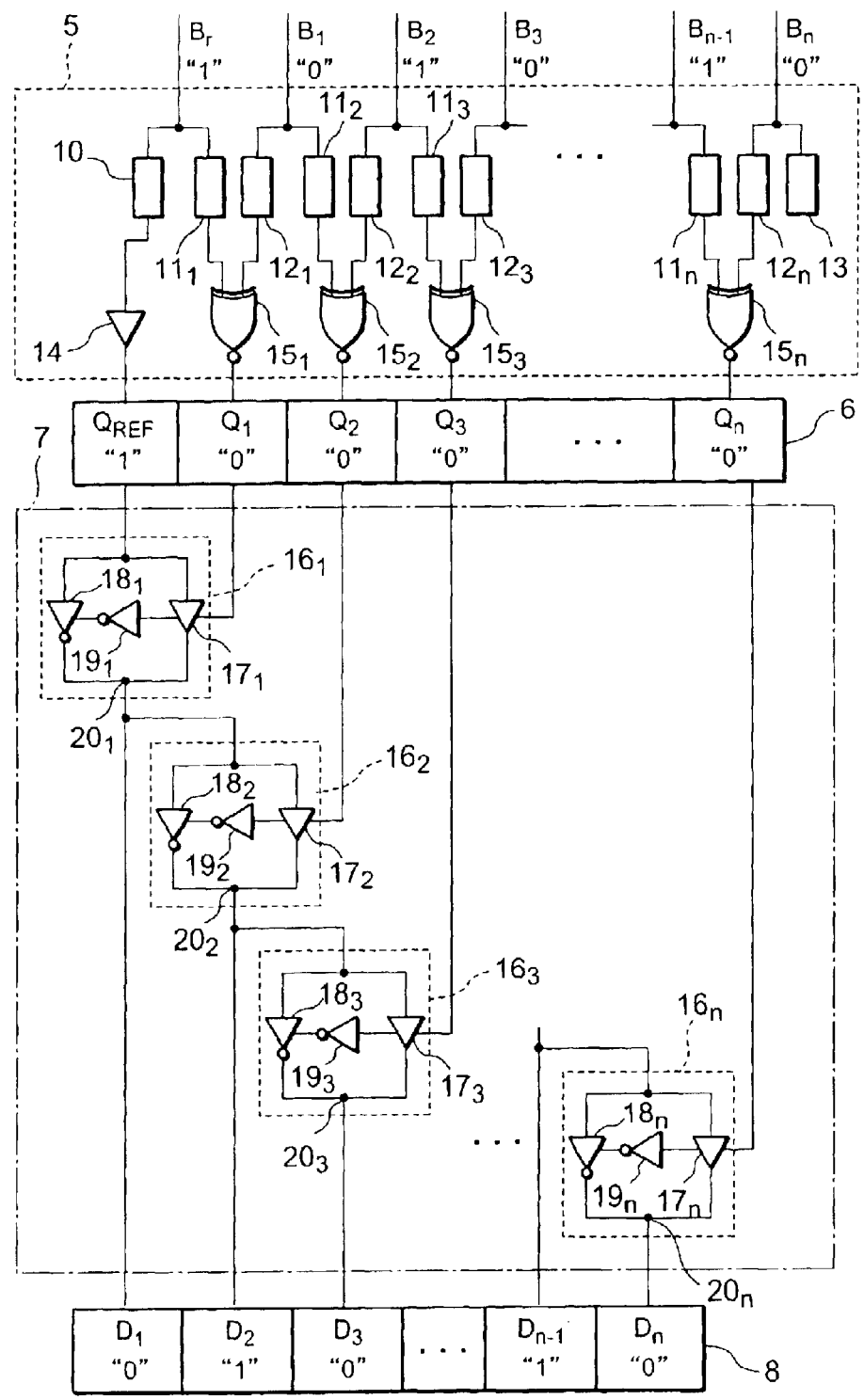
FIG. 3 is a detailed diagram illustrating a sense amplifier 5, a first register 6, a decoder 7 and a second register 8.
Figure 4:
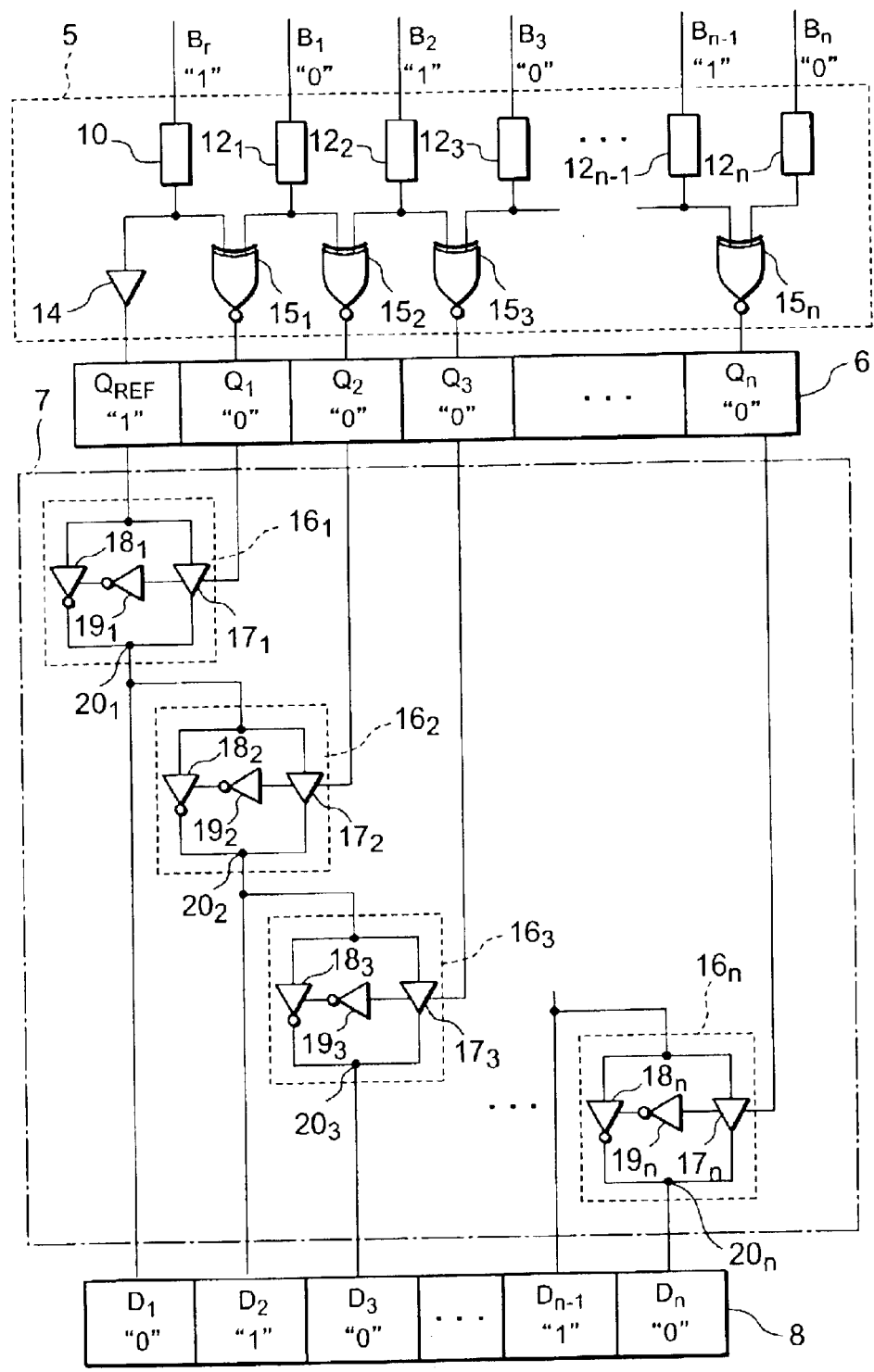
FIG. 4 illustrates a modification example of the sense amplifier 5.

FIG. 3 is a detailed diagram illustrating the sense amplifier 5, the first register 6, the decoder 7 and the second register 8. The sense amplifier 5 includes an I-V converter 10, I-V converters $11_1$ to $11_n$, I-V converters $12_1$ to $12_n$, an I-V converter 13, a buffer 14 and exclusive NOR (EX-NOR) circuits $15_1$ to $15_n$. The I-V converter 10, the I-V converters $11_1$ to $11_n$, the I-V converters $12_1$ to $12_n$ and the I-V converter 13 each have the same circuit configuration and are designed to exhibit substantially the same input-output characteristics.

The input of the I-V converter 10 and the input of the I-V converter $11_1$ are connected to the reference bit line $B_r$. Current passing through each of the reference cells $R_1$ to $R_m$ to the reference bit line $B_r$ is equally delivered to the I-V converter 10 and the I-V converter $11_1$. The I-V converter 10 and the I-V converter 111 each output "1" when current flowing through the reference bit line $B_r$ to the corresponding converter is larger than a specific reference current and output "0" when current flowing through the reference bit line $B_r$ to the corresponding converter is smaller than the specific reference current. The memory cell array 1 is designed such that "1" is written into the reference cells $R_1$ to $R_m$ and current flowing through the reference bit line $B_r$ to each of the I-V converter 10 and the I-V converter $11_1$ is larger than the reference current. Therefore, the I-V converter 10 and the I-V converter $11_1$ always output "1."

The inputs of the I-V converters $12_j$ and $11_{(j+1)}$ (j represents integer not less than 1 and not greater than (n−1)) out of the I-V converters $11_1$ to $11_n$ and $12_1$ to $12_n$ are connected to the bit line $B_j$. Current flowing through the memory cells $C_{1j}$ to $C_{mj}$ to the bit line $B_j$ is equally delivered to the I-V converters $11_{(j+1)}$ and $12_j$. The I-V converters $11_{(j+1)}$ and $12_j$ each output "0" when current flowing through the bit line $B_j$ to the corresponding converter is larger than a specific reference current and output "1" when current flowing through the bit line $B_j$ to the corresponding converter is smaller than the specific reference current.

The input of the I-V converter $12_n$ and the input of the I-V converter 13 are connected to the reference bit line $B_n$. Current flowing through the memory cells $C_{1n}$ to $C_{mn}$ to the bit line $B_n$ is equally delivered to the I-V converters $12_n$ and 13. The I-V converters $12_n$ and 13 each output "0" when current flowing through the bit line $B_n$ to the corresponding converter is larger than a specific reference current and output "1" when current flowing through the bit line $B_n$ to the corresponding converter is smaller than the specific reference current.

The output of the I-V converter 10 is connected to the input of the buffer 14. The buffer 14 outputs the same value as that received from the I-V converter 10 as a reference bit $Q_{REF}$ to the first register 6. As is already described, since the I-V converter 10 always outputs "1," the reference bit $Q_{REF}$ is always "1."

The outputs of the I-V converters $11_j$ and $12_j$ out of the I-V converters $11_1$ to $11_n$ and $12_1$ to $12_n$ are connected to the inputs of the EX-NOR circuit $15_j$. In the EX-NOR circuit $15_j$, the output of the I-V converter $11_j$ and the output of the I-V converter $12_j$ are exclusive NOR'ed to be outputted as the comparison result bit $Q_j$.

The I-V converter 13 is provided for balancing electrical performance of the bit line $B_n$ and electrical performances of other bit lines $B_1$ to $B_{(n-1)}$, and the output of the I-V converter 13 is connected to none.

When the word line $W_i$ is enabled, the sense amplifier 5 constructed as described above outputs "1" as the comparison result bit $Q_1$ when data output to the bit line $B_1$ from the memory cell $C_{i1}$ out of the memory cells $C_{11}$ to $C_{m1}$ is "1" that coincides with the data stored in the reference cell $R_i$ and outputs "0" as the comparison result bit $Q_1$ when data output to the bit line $B_1$ is "0" that does not coincide with the data stored in the reference cell $R_i$.

Additionally, assuming j represents integer not less than 2 and not greater than n, the sense amplifier 5 outputs "1" as the comparison result bit $Q_j$ when data output to the bit line $B_{(j-1)}$ from the memory cell $C_{i(j-1)}$ coincides with data output to the bit line $B_j$ from the memory cell $C_{ij}$ and outputs "0" as the comparison result bit $Q_j$ when the data output to the bit line $B_{(j-1)}$ does not coincide with the data output to the bit line $B_j$.

The first register 6 receives the reference bit $Q_{REF}$ and the comparison result bits $Q_1$ to $Q_n$ from the sense amplifier 5 to store the same.

The decoder 7 provided to reproduce the data $D_1$ to $D_n$ stored in the memory cells $C_{i1}$ to $C_{in}$ based on the reference bit $Q_{REF}$ and the comparison result bits $Q_1$ to $Q_n$ includes data reproducers $16_1$ to $16_n$. The data reproducer $16_1$ includes a buffer $17_1$, inverters $18_1$, $19_1$ and an output node $20_1$. Likewise, assuming i represents integer not less than 2 and not greater than n, the data reproducer $16_i$ includes a buffer $17_i$, inverters $18_i$, $19_i$ and an output node $20_i$.

The data reproducer $16_1$ reproduces the data $D_1$ stored in the memory cell $C_{i1}$ based on the reference bit $Q_{REF}$ and the comparison result bit $Q_1$.

In more detail, the reference bit $Q_{REF}$ is input to the input terminal of the buffer $17_1$ included in the data reproducer $16_1$ and the comparison result bit $Q_1$ is input to the enable terminal of the buffer $17_1$. The buffer $17_1$ is enabled when the comparison result bit $Q_1$ is "1" and outputs the same value as that of the reference bit $Q_{REF}$, i.e., "1." When the buffer $17_1$ is not enabled, the output of the buffer $17_1$ becomes a high impedance state.

The reference bit $Q_{REF}$ is input to the input terminal of the inverter $18_1$, and the inverted value of the comparison result bit $Q_1$ is input to the enable terminal of the inverter $18_1$ via the inverter $19_1$. The inverter $18_1$ is enabled when the comparison result bit $Q_1$ is "0" and outputs the inverted value of the reference bit $Q_{REF}$, i.e., "0." When the inverter $18_1$ is not enabled, the output of the inverter $18_1$ becomes a high impedance state.

The outputs of the buffer $17_1$ and the inverter $18_1$ are connected to the output node $20_1$. The output node $20_1$ is connected to a second register 8. The output node $20_1$ outputs the data $D_1$ reproduced by the data reproducer $16_1$ and stored in the memory cell $C_{i1}$.

In response to the comparison result bit $Q_1$, the data reproducer $16_1$ constructed as described above outputs the same value (i.e., "1") as that of the reference bit $Q_{REF}$ when the data stored in the memory cell $C_{i1}$ and the reference bit $Q_{REF}$ coincide with each other, i.e., the comparison result bit $Q_1$ being "1." Furthermore, the data reproducer $16_1$ outputs a value (i.e., "0") different from that of the reference bit $Q_{REF}$ when the data stored in the memory cell $C_{i1}$ and the reference bit $Q_{REF}$ are different from each other, i.e., the comparison result bit $Q_1$ being "0." As is already described, since the comparison result bit $Q_1$ becomes "1" when the data stored in the memory cell $C_{i1}$ and the reference bit $Q_{REF}$ coincide with each other and becomes "0" when the above-mentioned two are different from each other, the data $D_1$ stored in the memory cell $C_{i1}$ is reproduced by such operation of the data reproducer $16_1$.

The data reproducer $16_2$ reproduces the data $D_2$ stored in the memory cell $C_{i2}$ based on the data $D_1$ reproduced by the data reproducer $16_1$ and the comparison result bit $Q_2$. Likewise, assuming j represents integer not less than 2 and not greater than n, the data reproducer $16_j$ reproduces the data $D_j$ stored in the memory cell $C_{ij}$ based on the data $D_{(j-1)}$ reproduced by the data reproducer $16_{(j-1)}$ and the comparison result bit $Q_j$.

In more detail, the data $D_{(j-1)}$ reproduced by the data reproducer $16_{(j-1)}$ is input to the input terminal of the buffer $17_j$ included in the data reproducer $16_j$ and the comparison result bit $Q_j$ is input to the enable terminal of the buffer $17_j$. The buffer $17_j$ is enabled when the comparison result bit $Q_j$ is "1" and outputs the same value as that of the data $D_{(j-1)}$ reproduced by the data reproducer $16_{(j-1)}$. When the buffer $17_j$ is not enabled, the output of the buffer $17_j$ becomes a high impedance state.

The data $D_{(j-1)}$ reproduced by the data reproducer $16_{(j-1)}$ is input to the input terminal of the inverter $18_j$ and the inverted value of the comparison result bit $Q_j$ is input to the enable terminal of the inverter $18_j$ via the inverter $19j$. The inverter $18j$ is enabled when the comparison result bit $Q_j$ is "0" and outputs the inverted value of the data $D_{(j-1)}$. When the inverter $18_j$ is not enabled, the output of the inverter $18_j$ becomes a high impedance state.

The outputs of the buffer $17_j$ and the inverter $18_j$ are connected to the output node $20_j$. The output node $20_j$ is connected to a second buffer 8. The output node $20_j$ outputs the data $D_j$ reproduced by the data reproducer $16_j$ and stored in the memory cell $C_{ij}$.

In response to the comparison result bit $Q_j$, the data reproducer $16_j$ constructed as described above outputs the same value (i.e., "1") as that of the data stored in the memory cell $C_{i(j-1)}$ when the data stored in the memory cell $C_{i(j-1)}$ and the data stored in the memory cell $C_{ij}$ coincide with each other, i.e., the comparison result bit $Q_j$ being "1." Furthermore, the data reproducer $16_j$ outputs the inverted value of the data stored in the memory cell $C_{i(j-1)}$ when the data stored in the memory cell $C_{i(j-1)}$ and the data stored in the memory cell $C_{ij}$ are different from each other, i.e., the comparison result bit $Q_j$ being "0." As is already described, since the data reproducer $16_1$ operates such that the comparison result bit $Q_j$ becomes "1" when the data stored in the memory cell $C_{i(j-1)}$ and the data stored in the memory cell $C_{ij}$ coincide with each other and becomes "0" when the above-mentioned two are different from each other, the data $D_j$ stored in the memory cell $C_{ij}$ is reproduced by such operation of the data reproducer $16_j$. The data $D_1$ to $D_n$ reproduced respectively by the data reproducers $16_1$ to $16_n$ is output to the outside via the second register 8.

Subsequently, how the semiconductor memory device of the embodiment performs a read operation will be explained.

The word line $W_i$ included in the word lines $W_1$ to $W_m$ and specified by the row address X is enabled by the word line decoder 2. A read operation is performed on the memory cells $C_{i1}$ to $C_{in}$ connected to the word line $W_i$.

First, with reference to the reference cell $R_i$ connected to the word line $W_i$, a read operation is performed on the memory cell $C_{ij}$ adjacent to the reference cell $R_i$.

In more detail, the reference bit line $B_r$ connected to the reference cell $R_i$ and the bit line $B_1$ connected to the memory cell $C_{i1}$ are enabled by the bit line decoder 3 and the bit line selector 4, and then, a specific potential difference is applied between the word line $W_i$ and the reference bit line $B_r$, and between the word line $W_i$ and the bit line $B_1$. By application of the potential difference, a reference current $I_{REF}$ corresponding to the data (i.e., data "1") stored in the reference cell R. sub._1 flows through the reference cell $R_i$ into the reference bit line $B_r$, and further, a data current $I_i$. sub._1 corresponding to the data stored in the memory cell $C_{i1}$ flows through the memory cell $C_{i1}$ into the bit line $B_1$.

The data stored in the reference cell $R_i$ is identified by the I-V converter 10 and the buffer 14, both being included in the sense amplifier 5, based on the reference current $I_{REF}$ and then, a reference bit $Q_{REF}$ indicating the identified data is output. As is already described, since data "1" is stored in the reference cell $R_i$, "1" is output as the reference bit $Q_{REF}$.

Whether the data stored in the reference cell $R_i$ and the data stored in the memory cell $C_{i1}$ coincide with each other or are different from each other is determined by the I-V converters $11_1$, $12_1$ and a EX-NOR gate $15_1$ of the sense amplifier 5 based on the reference current $I_{REF}$ and the data current $I_{i1}$. When the data stored in the reference cell $R_i$ and the data stored in the memory cell $C_{i1}$ coincide with each other, the comparison result bit $Q_1$ is set to "1." When the data stored in the reference cell $R_i$ and the data stored in the memory cell $C_{i1}$ do not coincide with each other, the comparison result bit $Q_1$ is set to "0." As is indicated in the example shown in FIG. 3, when the data stored in the memory cell $C_{i1}$ is "0," the data stored in the memory cell $C_{i1}$ differs from the data stored in the reference cell $R_i$ and therefore, the comparison result bit $Q_1$ is set to "0." The comparison result bit $Q_1$ is output to the first register 6.

Furthermore, the data $D_1$ stored in the memory cell $C_{i1}$ is reproduced by the data reproducer $16_1$ based on the reference bit $Q_{REF}$ and the comparison result bit $Q_1$, and then, output to the second register 8.

Moreover, with reference to the memory cell $C_{i1}$, a read operation is performed on the memory cell $C_{i2}$ adjacent to the memory cell $C_{i1}$.

In more detail, the bit line $B_1$ connected to the memory cell $C_{i1}$ and the bit line $B_2$ connected to the memory cell $C_{i2}$ are enabled by the bit line decoder 3 and the bit line selector 4, and then, a specific potential difference is applied between the word line $W_i$ and the bit line $B_1$, and between the word line $W_i$ and the bit line $B_2$. By application of the potential difference, a data current $I_{i1}$ corresponding to the data stored in the memory cell $C_{i1}$ flows through the memory cell $C_{i1}$ into the bit line $B_1$, and further, a data current $I_{i2}$ corresponding to the data stored in the memory cell $C_{i2}$ flows through the memory cell $C_{i2}$ into the bit line $B_2$.

Whether the data stored in the memory cell $C_i1$ and the data stored in the memory cell $C_{i2}$ coincide with each other or are different from each other is determined by the I-V converters $11_2$, $12_2$ and a EX-NOR gate $15_2$ of the sense amplifier 5 based on the data current $I_{i1}$ and the data current $I_{i2}$. When the data stored in the memory cell $C_{i1}$ and the data stored in the memory cell $C_{i2}$ coincide with each other, the comparison result bit $Q_2$ is set to "1." When the data stored in the memory cell $C_{i1}$ and the data stored in the memory cell $C_{i2}$ do not coincide with each other, the comparison result bit $Q_2$ is set to "0." As is indicated in the example shown in FIG. 3, when the data stored in the memory cell $C_{i1}$ is "0" and the data stored in the memory cell $C_{i2}$ is "1", the data stored in the memory cell $C_{i2}$ differs from the data stored in the memory cell $C_{i1}$ and therefore, the comparison result bit $Q_2$ is set to "0." The comparison result bit $Q_2$ is output to the first register 6.

Furthermore, the data $D_2$ stored in the memory cell $C_{i2}$ is reproduced by the data reproducer $16_2$ included in the decoder 7 based on the data $D_1$ stored in the memory cell $C_{i1}$ and reproduced by the data reproducer $16_1$ and the comparison result bit $Q_2$, and then, output to the second register 8.

Subsequently, with the above-described operation being repeated, a read operation is performed on the memory cell $C_{ij}$ referring to the memory cell $C_{i(j-1)}$, and the data $D_1$ to $D_n$ stored in the memory cell $C_{i1}$ to $C_{in}$ is sequentially read and then, stored in the second register 8. The data $D_1$ to $D_n$ stored in the second register 8 is output to the outside.

In the embodiment, a read operation is performed on the memory cell $C_{i1}$ included in the memory cell array 1 and located on the outermost periphery of an area, within which data is to be stored, with reference to the reference current $I_{REF}$ flowing through the reference cell $R_i$. In addition, a read operation is performed on the memory cell $C_{i2}$ with reference to the data current $I_{i1}$ flowing through the memory cell $C_{i1}$ adjacent thereto. Subsequently, the same operation is performed on the memory cell $C_{ij}$ with reference to the data current $I_{i(j-1)}$ flowing through the memory cell $C_{i(j-1)}$ adjacent thereto.

The semiconductor memory device of the embodiment operating as described above is able to suppress influence of variation in electrical performance of memory cell and improve stability in operation for identifying data-stored in a memory cell. In the process for the manufacture of a memory cell, it is inevitable that a memory cell is formed to have some variation in its electrical performance. However, when looking over an entire memory cell array, some variation in electrical performance of memory cell is observed, but in general, when looking a limited part of the entire memory cell array, variation in electrical performance of memory cell is relatively small. That is, electrical performances of two memory cells positioned close to each other are substantially the same. When focusing on one memory cell and another memory cell positioned close to the one memory cell, a distance between those memory cells is short and variation in electrical performance of memory cell is relatively small. Therefore, since a read operation is performed on the memory cell $C_{i1}$ with reference to the reference cell $R_i$ adjacent to the memory cell $C_{i1}$ and a read operation is performed on the memory cell $C_{i2}$ with reference to the memory cell $C_{i1}$ positioned adjacent to the memory cell $C_{i2}$ and nearer the memory cell $C_{i2}$ than the reference cell $R_i$, a distance between a memory cell, from which data is read, and a memory cell (or a reference cell) referred during the read operation is made shorter, thereby allowing the semiconductor memory device to perform a read operation suppressing influence of variation in electrical performance of memory cell.

It should be noted that in the semiconductor memory device of the embodiment, as shown in FIG. 3, although the reference bit line $B_r$ is connected to two I-V converters 10, $11_1$ and the bit line $B_j$ is connected to two I-V converters $12_j$, $11_{(j+1)}$ (j represents integer not less than 1 and not greater than (n−1)), instead, the reference bit line $B_r$ and the bit lines $B_1$ to $B_n$ each may be connected to one corresponding I-V converter. In this case, the reference bit line $B_r$ is connected to an I-V converter 10 and the bit lines $B_1$ to $B_n$ are connected respectively to I-V converters $12_1$ to $12_n$. The I-V converter 10 outputs "1" to a buffer 14 when a current flows through the reference bit line $B_r$ into the corresponding I-V converter is larger than a specific reference current and outputs "0" to the buffer 14 when a current flows through the reference bit line $B_r$ into the corresponding I-V converter is smaller than the specific reference current. Likewise, the I-V converters $12_1$ to $12_n$ each output "1" to the corresponding EX-NOR circuits $15_1$ to $15_n$ when a current flows through each of the bit lines $B_1$ to $B_n$ into the corresponding one of the I-V converters is larger than a specific reference current and output "0" to the corresponding EX-NOR circuits $15_1$ to $15_n$ when a current flows through each of the bit lines $B_1$ to $B_n$ into the corresponding one of the I-V converters is smaller than the specific reference current. Even in this case, the semiconductor memory device of the embodiment performs the same operation as that previously explained in the description of the embodiment shown in FIG. 3.

Figure 5:
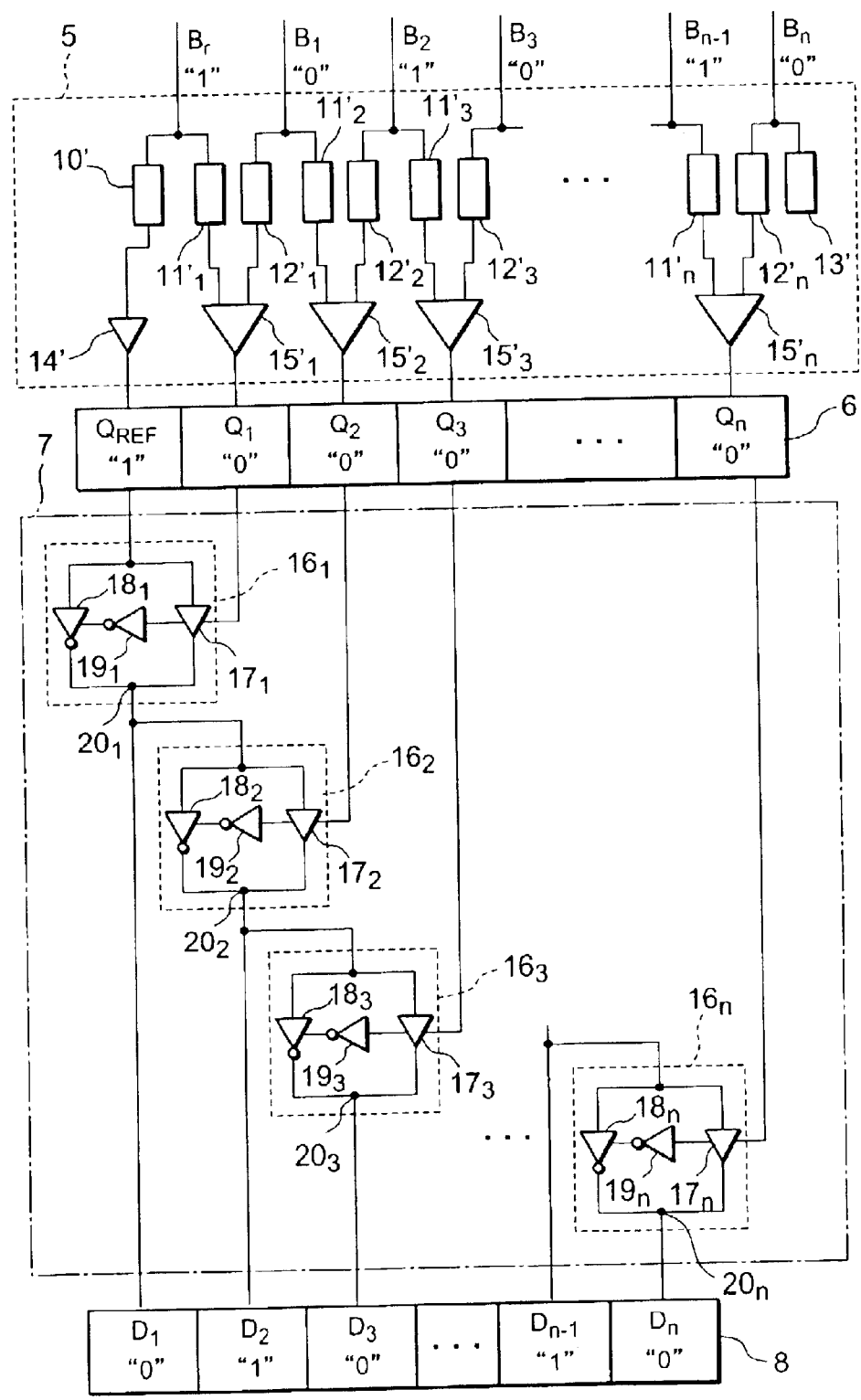
FIG. 5 illustrates another modification example of the sense amplifier 5.

Furthermore, as shown in FIG. 5, the sense amplifier 5 to be employed in the present invention can be modified to include I-V converters 10', $11'_1$ to $11'_n$, $12'_1$ to $12'_n$, 13', a buffer 14' and comparators $15'_1$ to $15'_n$.

The I-V converters 10', $11'_1$ to $11'_n$, $12'_1$ to $12'_n$ and 13' each output a voltage corresponding to the amount of current flowing thereto. In more detail, the I-V converters 10' and $11'_1$ each output a voltage corresponding to the amount of current flowing thereto. Likewise, the I-V converters $12'_k$, $11'_{(k+1)}$ (k represents integer not less than 1 and not greater than (n−1)) each output a voltage corresponding to the amount of current flowing through the bit line $B_j$ thereto and the I-V converters $12'_n$, 13' each output a voltage corresponding to the amount of current flowing through the bit line $B_n$ thereto. The I-V converters 10', $11'_1$ to $11'_n$, $12'_1$ to $12'_n$ and 13' each output a voltage that becomes higher in proportion to the amount of current flowing thereto.

The buffer 14' is connected to the I-V converter 10' and outputs "1" when a voltage output from the I-V converter 10' is larger than a specific reference voltage, and outputs "0" when a voltage output therefrom is lower than the specific reference voltage. The value output from the buffer 14' is stored in a first register 6 as a reference bit $Q_{REF}$.

The comparator $15'_1$ out of the comparators $15'_1$ to $15'_n$ determines whether the data previously stored in the reference cell $R_i$ and the data stored in the memory cell $C_{i1}$ coincide with each other or are different from each other based on the voltages output respectively from the I-V converter $11'_1$ and the I-V converter $12'_1$. When the comparator $15'_1$ determines that the data previously stored in the reference cell $R_i$ and the data stored in the memory cell $C_{i1}$ coincide with each other, the comparator $15'_1$ makes the comparison result bit $Q_1$ become "1" and outputs the same to the first register 6, and when the comparator $15'_1$ determines that the above-mentioned two data do not coincide with each other, the comparator $15'_1$ makes the comparison result bit $Q_1$ become "0" and outputs the same to the first register 6.

Likewise, the comparator $15'_j$ (j represents integer not less than 2 and not greater than n) out of the comparators $15'_1$ to $15'_n$ determines whether the data stored in the memory cell $C_{i(j-1)}$ and the data stored in the memory cell $C_{ij}$ coincide with each other or are different from each other based on the voltages output respectively from the I-V converter $11'_j$ and the I-V converter $12'_j$. When the comparator $15'_j$ determines that the data stored in the memory cell $C_{i(j-1)}$ and the data stored in the memory cell $C_{ij}$ coincide with each other, the comparator $15'_j$ makes the comparison result bit $Q_j$ become "1" and outputs the same to the first register 6, and when the comparator $15'_j$ determines that the above-mentioned two data do not coincide with each other, the comparator $15'_j$ makes the comparison result bit $Q_j$ become "0" and outputs the same to the first register 6.

Even in the case where the sense amplifier 5 is constructed as described above, the semiconductor memory device of the embodiment performs an operation similar to that previously explained in the description of the embodiment shown in FIG. 3. Based on the reference current $I_{REF}$ and the data current $I_{i1}$, the comparison result bit $Q_1$ indicating whether the data stored in the reference cell $R_i$ and the data stored in the memory cell $C_{i1}$ coincide with each other or are different from each other is produced, and then, based on the reference data $D_{REF}$ stored in the reference cell $R_i$ and the comparison result bit $Q_1$, the data $D_{i1}$ stored in the memory cell $C_{i1}$ is identified. Likewise, based on the data current $I_{i(j-1)}$ and the data current $I_{ij}$, the comparison result bit $Q_j$ indicating whether the data stored in the memory cell $C_{i(j-1)}$ and the data stored in the memory cell $C_{ij}$ coincide with each other or are different from each other is produced, and then, based on the data $D_{i(j-1)}$ stored in the memory cell $C_{i(j-1)}$ and the comparison result bit $Q_j$, the data $D_{ij}$ stored in the memory cell $C_{ij}$ is identified.

Furthermore, when data stored in the reference cells $R_1$ to $R_m$ is fixed, the above-described buffers 14, 14' do not need to be provided in the semiconductor memory device of the embodiment. When "1" is stored in the reference cells $R_1$ to $R_m$, the reference bit $Q_{REF}$ is fixed at "1" and when "0" is stored in the reference cells $R_1$ to $R_m$, the reference bit $Q_{REF}$ is fixed at "0."

Figure 6:
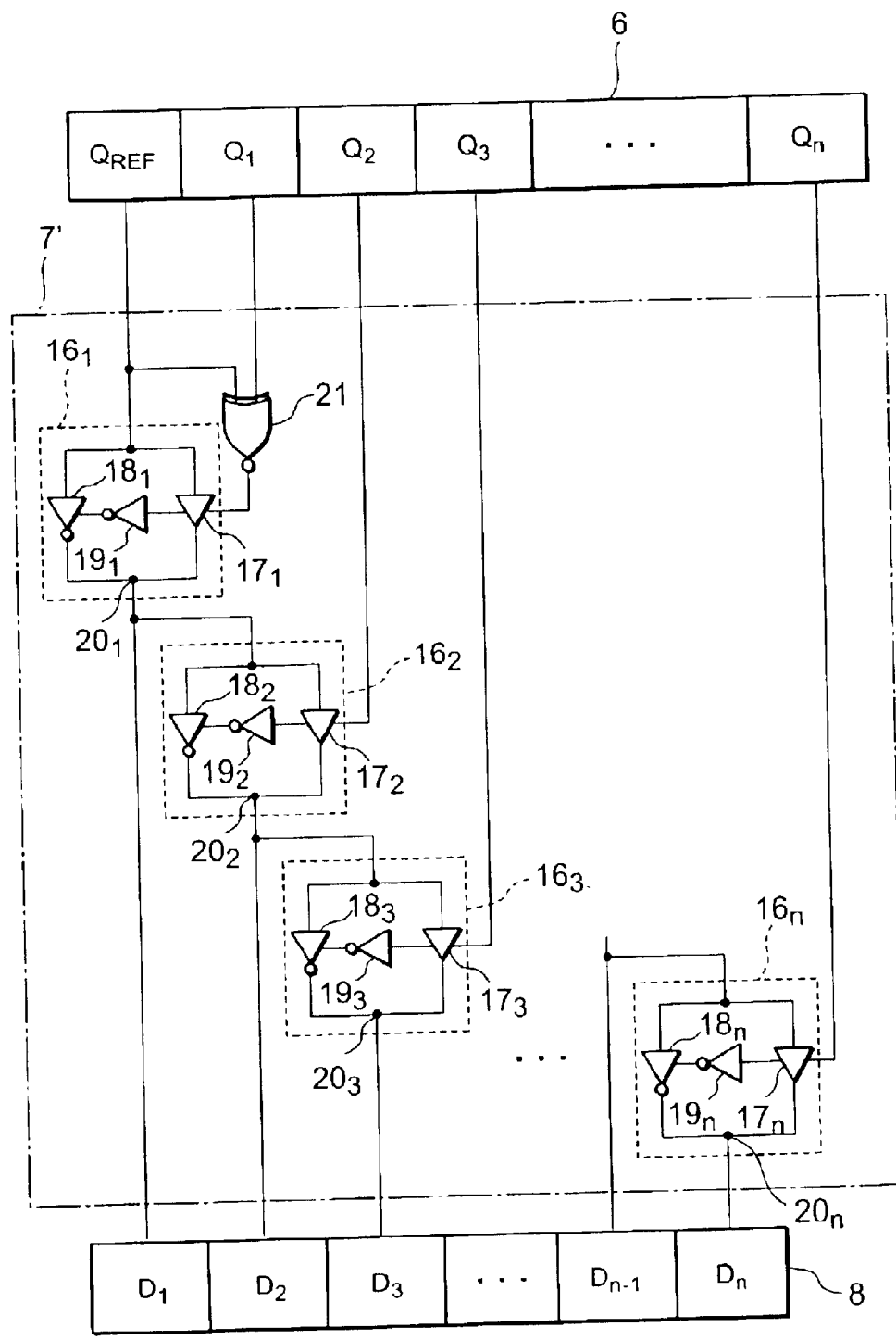
FIG. 6 illustrates a modification example of the decoder 7.

Moreover, as described above, although data "1" is previously stored in the reference cells $R_1$ to $R_m$ of the semiconductor memory device of the embodiment, the configuration that permits one optionally selected from data "1" and data "0" to previously be stored in each of the reference cells $R_1$ to $R_m$ may be applied to the embodiment. In this case, as shown in FIG. 6, an EX-NOR circuit 21 is added to the decoder 7. To the EX-NOR circuit 21 are input the $Q_{REF}$ indicating data stored in the reference cells $R_1$ to $R_m$ and the comparison result bit $Q_1$. The buffer $17_1$ is enabled when the output of the EX-NOR circuit 21 is "1" and the output of the buffer $17_1$ becomes a high impedance state when the output of the EX-NOR circuit 21 is "0." The inverter $18_1$ is enabled when the output of the EX-NOR circuit 21 is "0" and the output of the inverter $18_1$ becomes a high impedance state when the output of the EX-NOR circuit 21 is "1."

Figure 12:
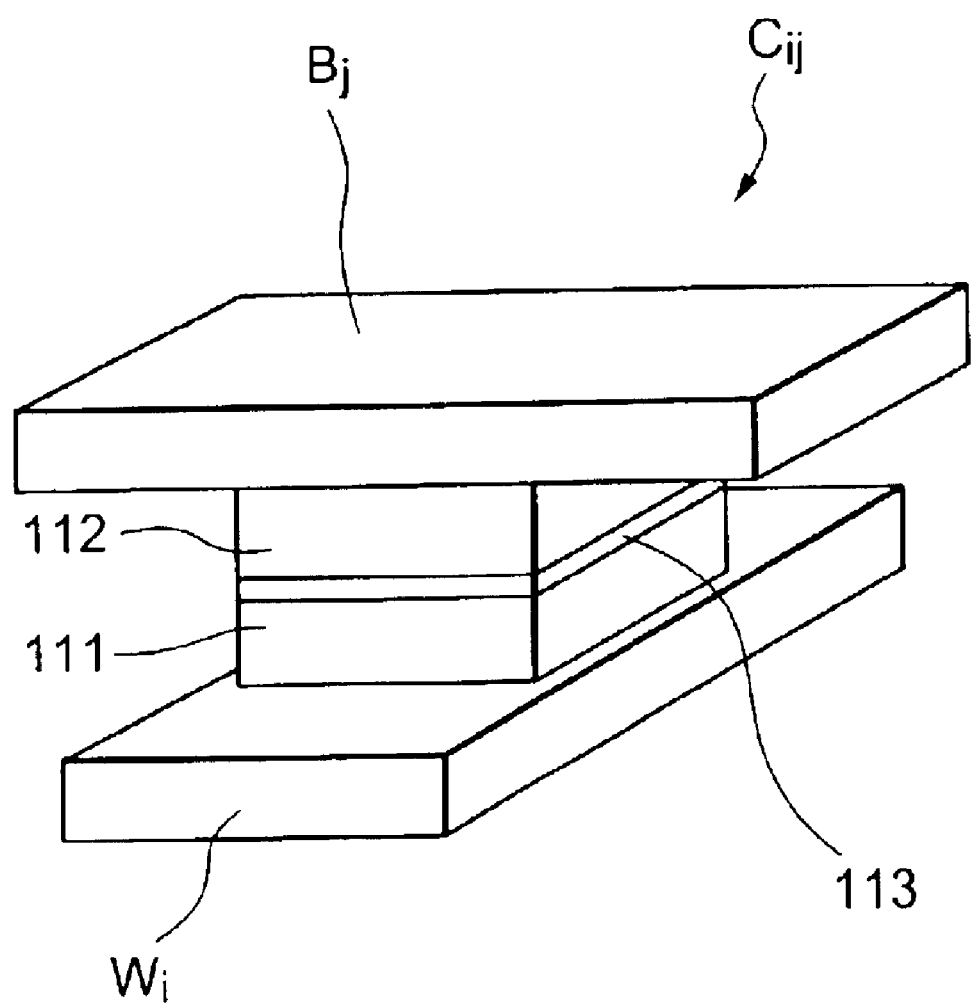
FIG. 12 illustrates a memory cell $C_{ij}$.
Figure 13:
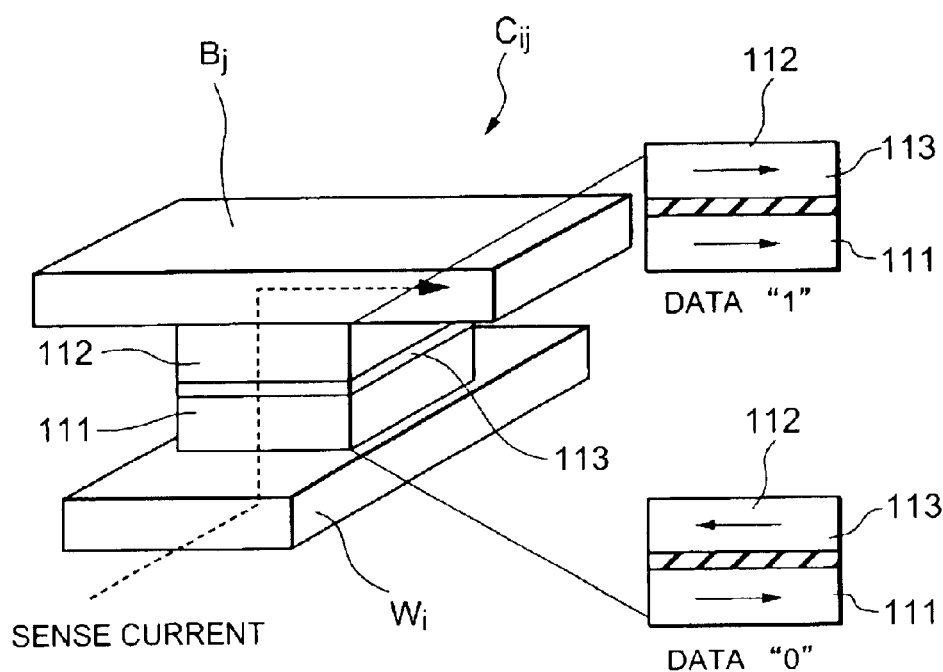
FIG. 13 is a diagram explaining how the memory cell $C_{ij}$ operates.

Additionally, although the semiconductor memory device of the embodiment employs a memory cell from which data is read by sensing a current utilizing TMR effect shown in FIG. 12, instead, the invented semiconductor memory device may employ another type of memory cell on which a read operation is performed by sensing a current. For example, the invented semiconductor memory device may employ a memory cell used in EEPROM instead of the above-described memory cell shown in FIG. 12. That is, a MOS transistor has a floating gate formed therein and a read operation is performed on the memory cell such that a current flowing between a source and a drain varies depending on an amount of electrical charges accumulated in the floating gate and a difference in the amount of the current flowing therebetween is detected.

(Second Embodiment)

Figure 7:
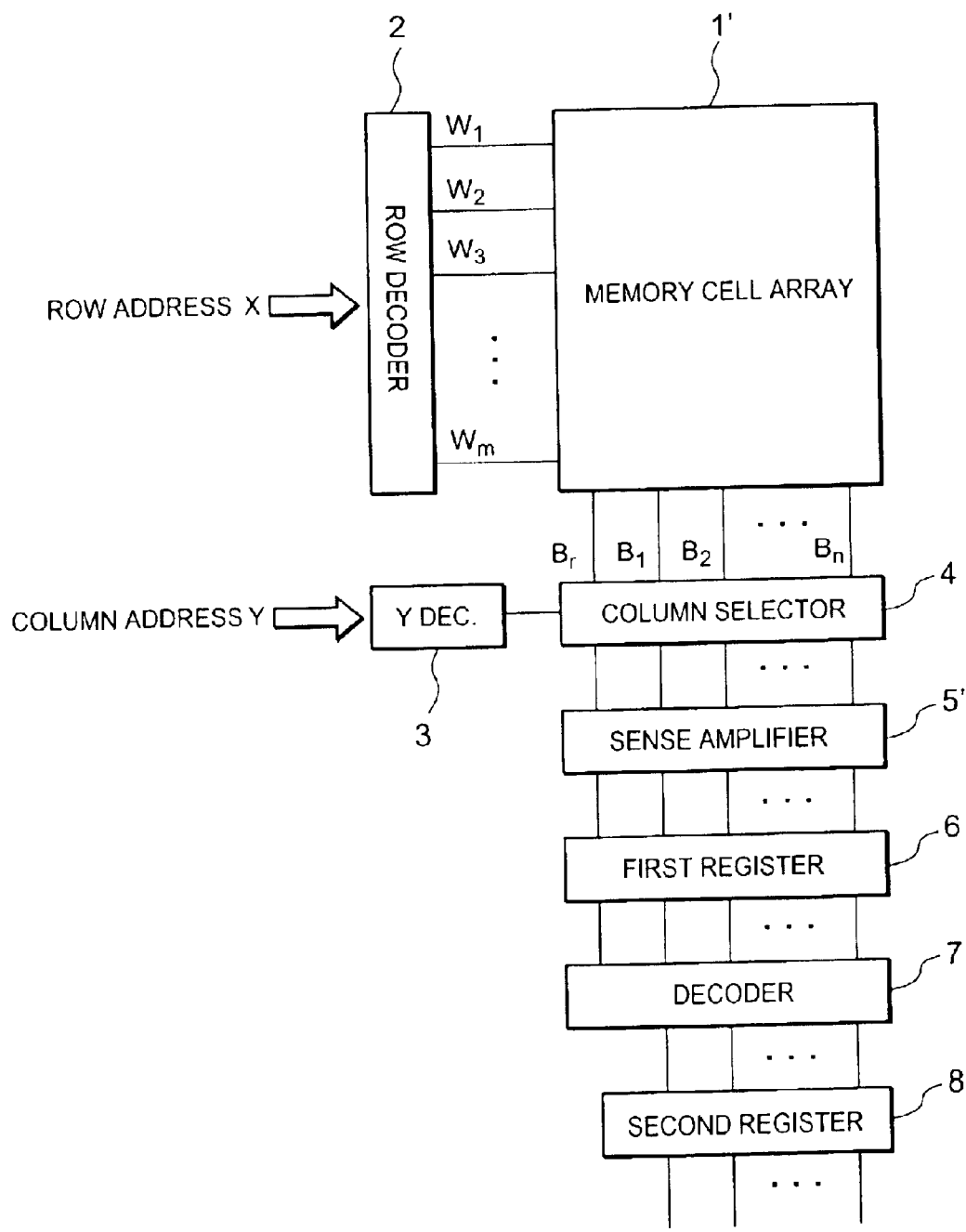
FIG. 7 illustrates a semiconductor memory device of a second embodiment constructed in accordance with the present invention.

FIG. 7 illustrates a semiconductor memory device of a second embodiment constructed in accordance with the present invention. The semiconductor memory device of the second embodiment is a FRAM that uses a memory cell array 1'. A FRAM memory cell has a ferroelectric capacitor a transistor. Although the memory cell array 1 of the first embodiment uses the memory cells $C_{11}$ to $C_{mn}$ consisting of a memory cell that stores data "0" or data "1" depending on directions of spontaneous magnetizations of associated layers of the memory cell, instead, a memory cell array 1' of the second embodiment uses memory cells $C_{11}$ to $C_{mn}$ consisting of a FRAM memory cell. Likewise, the memory cell array 1' of the second embodiment uses reference memory cells $R_1$ to $R_m$ consisting of a reference cell configured to have the same structure as that of each of the memory cells $C_{11}$ to $C_{mn}$. In the memory cell array 1' employing therein a memory cell, a data read operation is performed based on potentials present on bit lines $B_1$ to $B_n$ and generated when a memory cell is connected to corresponding one of the bit lines $B_1$ to $B_n$. This configuration of memory cell requires the second embodiment to employ a sense amplifier 5' for detecting a potential present on each of the lines $B_1$ to $B_n$ instead of the sense amplifier 5 employed in the first embodiment.

The semiconductor memory device of the second embodiment has the same configuration as that of the semiconductor memory device of the first embodiment except for the memory cell array 1' and the sense amplifier 5', and therefore, the detailed description of the corresponding parts and components is omitted.

Figure 8:
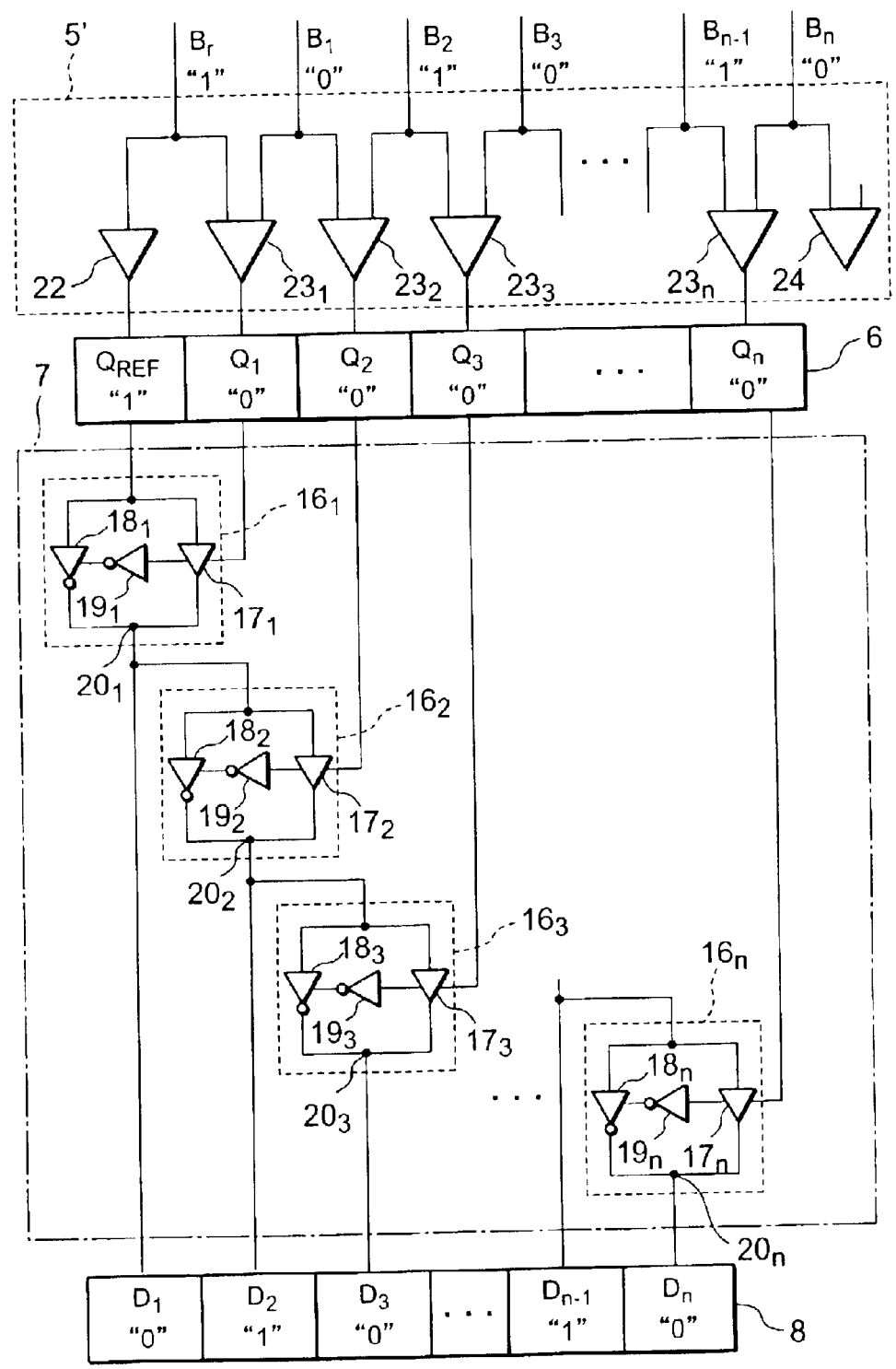
FIG. 8 illustrates a sense amplifier 5'.
Figure 9:
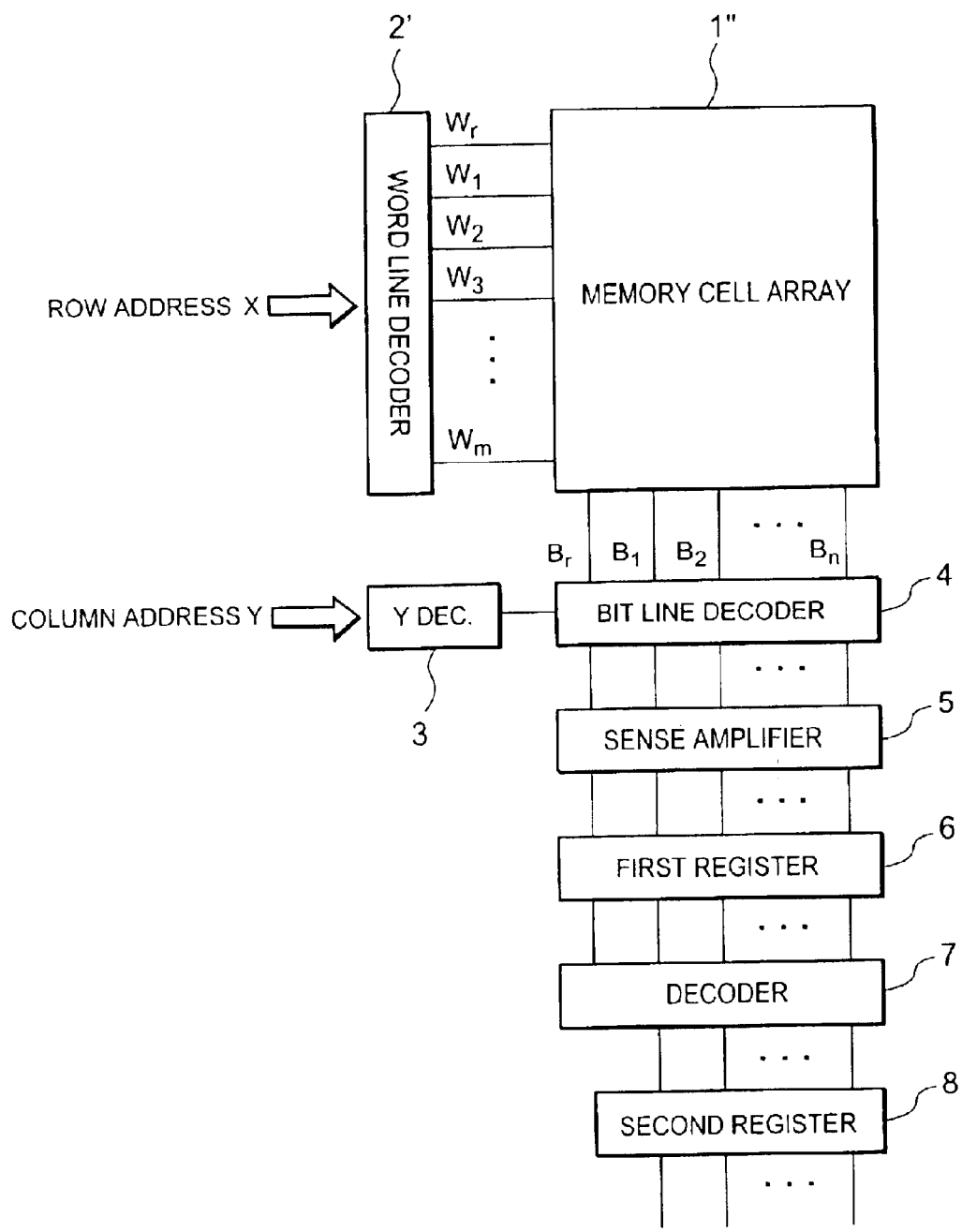
FIG. 9 illustrates a semiconductor memory device of a third embodiment constructed in accordance with the present invention.

FIG. 8 illustrates the configuration of the sense amplifier 5'. The sense amplifier 5' includes a buffer 22, comparators $23_1$ to $23_n$ and a comparator 24. The input of the buffer 22 is connected to a reference bit line $B_r$. The buffer 22 outputs a reference bit $Q_{REF}$ based on a potential present on the reference bit line $B_r$. When the potential present on the reference bit line $B_r$ is higher than a specific reference potential, the buffer 22 makes the reference bit $Q_{REF}$ become "1" and outputs the same to a first register 6, and when the potential present on the reference bit line $B_r$ is lower than the specific reference potential, the buffer 22 makes the reference bit $Q_{REF}$ become "0," and outputs the same to the first register 6.

To the first input of a comparator $23_1$ is connected the reference bit $B_r$ and to the second input thereof is connected the bit line $B_1$. When the word line $W_i$ is enabled, the comparator $23_1$ determines whether the data previously stored in the reference cell $R_i$ and the data stored in the memory cell $C_{i1}$ coincide with each other or are different from each other based on the potential of the reference bit line $B_r$ and the potential of the bit line $B_1$ and then, outputs a comparison result bit $Q_1$. When the comparator $23_1$ determines that the data previously stored in the reference cell $R_i$ and the data stored in the memory cell $C_{i1}$ coincide with each other, the comparator $23_1$ makes the comparison result bit $Q_1$ become "1" and outputs the same to the first register 6, and when the comparator $23_1$ determines that the corresponding two data do not coincide with each other, the comparator $23_1$ makes the comparison result bit $Q_1$ become "0," and outputs the same to the first register 6.

Likewise, as for the comparators $23_2$ to $23_n$, assuming j represents integer not less than 2 and not greater than n, the bit line $B_{(j-1)}$ is connected to the first input of the comparator $23_j$ and the bit line $B_j$ is connected to the second input thereof. When the word line $W_i$ is enabled, the comparator $23_j$ determines whether the data stored in the memory cell $Ci_{(j-1)}$ and the data stored in the memory cell $C_{ij}$ coincide with each other or are different from each other based on the potential of the bit line $B_{(j-1)}$ and the potential of the bit line $B_j$ and then, outputs a comparison result bit $Q_j$. When the comparator $23_j$ determines that the data stored in the memory cell $C_{i(j-1)}$ and the data stored in the memory cell $C_{ij}$ coincide with each other, the comparator $23_j$ makes the comparison result bit $Q_j$ become "1" and outputs the same to the first register 6, and when the comparator $23_j$ determines that the corresponding two data do not coincide with each other, the comparator $23_j$ makes the comparison result bit $Q_j$ become "0," and outputs the same to the first register 6.

The reference bit $Q_{REF}$ and the comparison result bits $Q_i$ to $Q_n$ are output to the first register 6 and then, stored therein. As is the case with the first embodiment, a decoder 7 connected to the first register 6 reproduces the data $D_1$ to $D_n$ stored in the memory cells $C_{i1}$ to $C_{in}$ based on the reference bit $Q_{REF}$ and the comparison result bits $Q_1$ to $Q_n$, and outputs the same to a second register 8. The second register 8 stores the data $D_1$ to $D_n$ therein and outputs the same to the outside.

Subsequently, how the semiconductor memory device of the second embodiment performs a read operation will be explained. In the following description, assume that a read operation is performed on the memory cells $C_{i1}$ to $C_{in}$ connected to the word line $W_i$ out of the word lines $W_1$ to $W_m$.

First, specific data is written into the reference cells $R_1$ to $R_m$. In the following description, assume that "1" is written into the reference cells $R_1$ to $R_m$. In each of capacitors contained in the reference cells $R_1$ to $R_m$ is accumulated an amount of charges corresponding to data "1." Electric charges corresponding to data "1" are accumulated in a capacitor included in each of the reference cells $R_1$ to $R_m$.

Furthermore, the reference bit line $B_r$ and the bit lines $B_1$ to $B_n$ are pre-charged to one-half the voltage level of electric power supply $V_{cc}$.

Moreover, the word line $W_i$ is enabled by a word line decoder 2 and a data read operation performed on the memory cells $C_{i1}$ to $C_{in}$ starts.

A read operation is performed on the memory cell $C_{i1}$ adjacent to the reference cell $R_i$ with reference to the reference cell $R_i$. When the word line $W_i$ is enabled, charge transfer between the reference cell $R_i$ and the reference bit line $B_i$ is performed and the reference bit line $B_i$ will be at the voltage level $V_{REF}$ corresponding to data "1" stored in the reference cell $R_i$. Additionally, charge transfer between the memory cell $C_{i1}$ and the bit line $B_1$ is performed and the bit line $B_1$ will be at the voltage level $V_1$ corresponding to the data stored in the memory cell $C_{i1}$.

The data stored in the reference cell $R_i$ is identified by the buffer 22 based on the potential $V_{REF}$ of the reference bit line $B_i$ and the reference bit $Q_{REF}$ is set depending on which result that the buffer 22 determines is present. As is already described, since data "1" is stored in the reference cell $R_i$, the reference bit $Q_{REF}$ is set to "1."

Furthermore, the comparator $23_1$ of the sense amplifier 5' determines whether the data stored in the reference cell $R_i$ and the data stored in the memory cell $C_{i1}$ coincide with each other or are different from each other based on the potential $V_{REF}$ of the reference bit line $B_i$ and the potential $V_1$ of the bit line $B_1$. When the data stored in the reference cell $R_i$ and the data stored in the memory cell $C_{i1}$ coincide with each other, the comparison result bit $Q_1$ is set to "1." When the data stored in the reference cell $R_i$ and the data stored in the memory cell $C_{i1}$ do not coincide with each other, the comparison result bit $Q_1$ is set to "0." The comparison result bit $Q_1$ is output to the first register 6.

Additionally, the data $D_1$ stored in the memory cell $C_{i1}$ is reproduced by the data reproducer $16_1$ based on the reference bit $Q_{REF}$ and the comparison result bit $Q_1$, and then, output to the second register 8.

Moreover, a read operation is performed on the memory cell $C_{i2}$ adjacent to the memory cell $C_{i1}$ with reference to the memory cell $C_{i1}$.

As is already described, when the word line $W_i$ is enabled, charge transfer between the memory cell $C_{i1}$, and the bit line $B_1$ is performed and the bit line $B_1$ will be at the voltage level $V_1$ corresponding to the data stored in the memory cell $C_{i1}$. Additionally, in this case, charge transfer between the memory cell $C_{i2}$ and the bit line $B_2$ is performed and the bit line $B_2$ will be at the voltage level $V_2$ corresponding to the data stored in the memory cell $C_{i2}$.

The comparator $23_2$ determines whether the data stored in the memory cell $C_{i1}$ and the data stored in the memory cell $C_{i2}$ coincide with each other or are different from each other based on the potential $V_1$ of the bit line $B_1$ and the potential $V_2$ of the bit line $B_2$. When the data stored in the memory cell $C_{i1}$ and the data stored in the memory cell $C_{i2}$ coincide with each other, the comparison result bit $Q_2$ is set to "1." When the data stored in the memory cell $C_{i1}$ and the data stored in the memory cell $C_{i2}$ do not coincide with each other, the comparison result bit $Q_2$ is set to "0." The comparison result bit $Q_2$ is output to the first register 6.

Furthermore, the data D2 stored in the memory cell $C_{i2}$ is reproduced by the data reproducer $16_2$ included in the decoder 7 based on the data $D_1$ reproduced by the data reproducer $16_1$ and stored in the memory cell $C_{i1}$ and the comparison result bit $Q_2$, and then, output to the second register 8.

Subsequently, with the above-described operation being repeated, a read operation is performed on the memory cell $C_{ij}$ referring to the memory cell $C_{i(j-1)}$, and the data $D_1$ to $D_n$ stored in the memory cell $C_{i1}$ to $C_{in}$ is sequentially read and then, stored in the second register 8. The data $D_1$ to $D_n$ stored in the second register 8 is output to the outside.

In the embodiment, a read operation is performed on the memory cell $C_{i1}$ included in the memory cell array 1 and located on the outermost periphery of an area, within which data is to be stored, with reference to the reference cell $R_i$. In addition, a read operation is performed on the memory cell $C_{i2}$ with reference to the memory cell $C_{i1}$ adjacent thereto. Subsequently, the same operation is performed on the memory cell $C_{ij}$ with reference to the memory cell $C_{i(j-1)}$ adjacent thereto. The semiconductor memory device of the embodiment configured to operate as described above is able to suppress influence of variation in electrical performance of memory cell and enhance stability in operation for identifying data.

(Third Embodiment)

Although the semiconductor memory device of the first embodiment has the reference cells $R_1$ to $R_m$ provided therein so as to respectively correspond to the word lines $W_1$ to $W_m$, the semiconductor memory device of the third embodiment has one reference cell $R_{ef}$ provided therein so as to correspond to a memory cell array 1. Hereinafter, the memory cell array 1 having the one reference cell $R_{ef}$ provided therein will be referred to as a memory cell array 1". The configuration of the semiconductor memory device of the third embodiment excluding the above-described construction of memory cell array is the same as that of the semiconductor memory device of the first embodiment.

Figure 10:
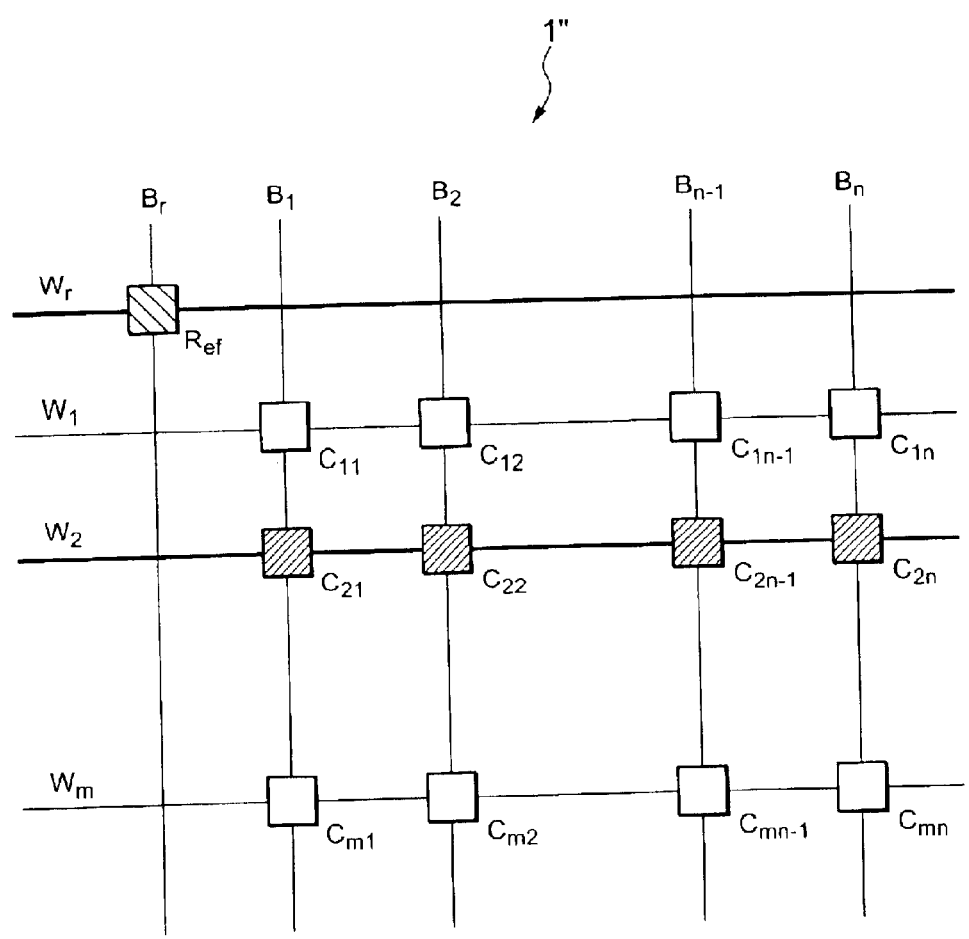
FIG. 10 illustrates a memory cell array 1"
Figure 11:
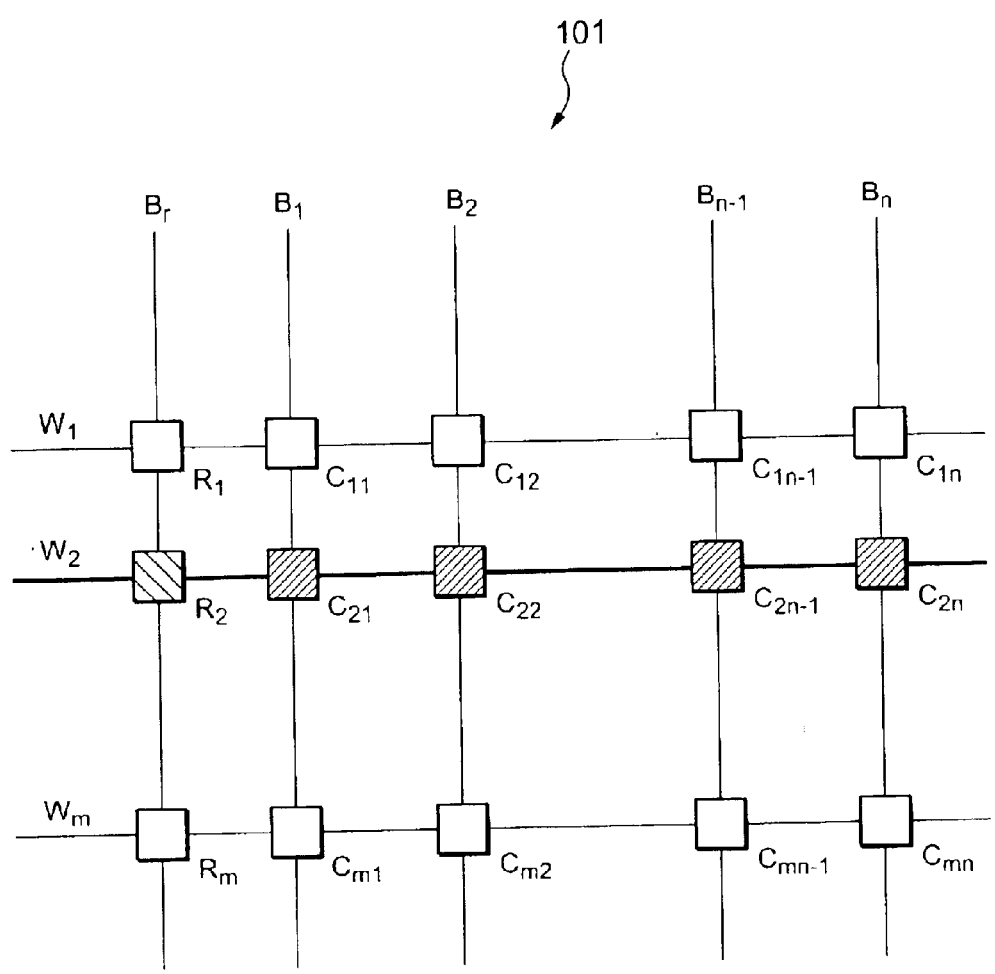
FIG. 11 illustrates a known memory cell array 101.

FIG. 10 illustrates the memory cell array 1". As is already explained in the description of the memory cell array 1 of the first embodiment, the memory cell array 1" is also constructed such that word lines $W_1$ to $W_m$ and bit lines $B_1$ to $B_n$ are provided extending within the memory cell array 1" and a memory cell $C_{ij}$ is provided at the intersection at which the word line $W_i$ and the bit line $B_j$ intersect one another. The structure of the memory cell $C_{ij}$ is the same as that explained referring to FIG. 12 in the description of the conventional technique.

Furthermore, a reference word line $W_r$ and a reference bit line $B_r$ each are provided extending within the memory cell array 1" and a reference cell $R_{ef}$ is provided at the intersection at which the reference word line $W_r$ and the reference bit line $B_r$ intersect one another. The reference cell $R_{ef}$ is connected to the reference word line $W_r$ and the reference bit line $B_r$. The reference cell $R_{ef}$ has the same structure as that of the memory cell $C_{ij}$.

Subsequently, how the semiconductor memory device of the third embodiment performs a read operation will be explained. In the following description, assume that data "1" is written into the reference cell $R_{ef}$.

The word line $W_i$ included in the word lines $W_1$ to $W_m$ and specified by the row address X is enabled by the word line decoder 2. A read operation is performed on the memory cells $C_{i1}$ to $C_{in}$ connected to the word line $W_i$. Additionally, the reference word line $W_r$ is enabled by the word line decoder 2. The reference word line $W_r$ is always enabled independent of whichever one of the word lines $W_1$ to $W_m$ is selected and the reference cell $R_{ef}$ is always referred when a read operation is performed on whichever one of the memory cells $C_{i1}$ to $C_{m1}$ that are located on the outermost periphery of the memory-cell array.

First, with reference to the reference cell $R_{ef}$, a read operation is performed on the memory cell $C_{i1}$ connected to the word line $W_i$.

In more detail, the reference bit line $B_r$ connected to the reference cell $R_{ef}$ and the bit line $B_1$ connected to the memory cell $C_{i1}$ are enabled by a bit line decoder 3 and a bit line selector 4, and then, a specific potential difference is applied between the word line $W_i$ and the reference bit line $B_r$, and between the word line $W_i$ and the bit line $B_1$. By application of the potential difference, a reference current $I_{REF}$ corresponding to the data (i.e., data "1") stored in the reference cell $R_1$ flows through the reference cell $R_{ef}$ to the reference bit line $B_r$, and further, a data current $I_{i1}$ corresponding to the data stored, in the memory cell $C_{i1}$ flows through the memory cell $C_{i1}$ to the bit line $B_1$.

The data stored in the reference cell $R_{ef}$ is identified by an I-V converter 10 and a buffer 14, both being included in the sense amplifier 5, based on the reference current $I_{REF}$ and then, a reference bit $Q_{REF}$ indicating the identified data is output. As is already described, since data "1" is stored in the reference cell $R_{ef}$, "1" is output as the reference bit $Q_{REF}$. Furthermore, whether the data stored in the reference cell $R_{ef}$ and the data stored in the memory cell $C_{i1}$ coincide with each other or are different from each other is determined by the sense amplifier 5 based on the reference current $I_{REF}$ and the data current $I_{i1}$. When the data stored in the reference cell $R_{ef}$ and the data stored in the memory cell $C_{i1}$ coincide with each other, the comparison result bit $Q_1$ is set to "1." When the data stored in the reference cell $R_{ef}$ and the data stored in the memory cell $C_{i1}$ do not coincide with each other, the comparison result bit $Q_1$ is set to "0." The comparison result bit $Q_1$ is output to the first register 6.

Moreover, the data $D_1$ stored in the memory cell $C_{i1}$ is reproduced by a decoder 7 based on the reference bit $Q_{REF}$ and the comparison result bit $Q_1$, and then, output to a second register 8.

Additionally, with reference to the memory cell $C_{i1}$, a read operation is performed on the memory cell $C_{i2}$ adjacent to the memory cell $C_{i1}$.

In more detail, the bit line $B_1$ connected to the memory cell $C_{i1}$ and the bit line $B_2$ connected to the memory cell $C_{i2}$ are enabled, and then, a specific potential difference is applied between the word line $W_i$ and the bit line $B_1$, and between the word line $W_i$ and the bit line $B_2$. By application of the potential difference, a data current $I_{i1}$ corresponding to the data stored in the memory cell $C_{i1}$ flows through the memory cell $C_{i1}$ to the bit line $B_1$, and further, a data current $I_{i2}$ corresponding to the data stored in the memory cell $C_{i2}$ flows through the memory cell $C_{i2}$ to the bit line $B_2$.

Whether the data stored in the memory cell $C_{i1}$ and the data stored in the memory cell $C_{i2}$ coincide with each other or are different from each other is determined based on the data current $I_{i1}$ and the data current $I_{i2}$. When the data stored in the memory cell $C_{i1}$ and the data stored in the memory cell $C_{i2}$ coincide with each other, the comparison result bit $Q_2$ is set to "1." When the data stored in the memory cell $C_{i1}$ and the data stored in the memory cell $C_{i2}$ do not coincide with each other, the comparison result bit $Q_2$ is set to "0." As is indicated in the example shown in FIG. 3, when the data stored in the memory cell $C_{i1}$ is "0" and the data stored in the memory cell $C_{i2}$ is "1", the data stored in the memory cell $C_{i2}$ differs from the data stored in the memory cell $C_{i1}$ and therefore, the comparison result bit $Q_2$ is set to "0." The comparison result bit $Q_2$ is output to the first register 6.

Furthermore, the data $D_2$ stored in the memory cell $C_{i2}$ is reproduced by the decoder 7 based on the data $D_1$ stored in the memory cell $C_{i1}$ and the comparison result bit $Q_2$, and then, output to the second register 8.

Subsequently, with the above-described operation being repeated, a read operation is performed on the memory cell $C_{ij}$ referring to the memory cell $C_{i(j-1)}$, and the data $D_1$ to $D_n$ stored in the memory cell $C_{i1}$ to $C_{in}$ is sequentially read and then, stored in the second register 8. The data $D_1$ to $D_n$ stored in the second register 8 is output to the outside.

In the third embodiment, as is the case with the first and second embodiments, assuming j represents integer not less than 2 and not greater than n, a read operation is performed on the memory cell $C_{ij}$ with reference to the memory cell $C_{i(j-1)}$. Accordingly, a distance between a memory cell on which a read operation is to be performed and a memory cell to be referred during the read operation is made short and unfavorable influence of variation in electrical performance of memory cell due to the process variation in the manufacture of semiconductor memory device is suppressed.

Moreover, the third embodiment is configured to have the memory cell array 1" that includes only one reference cell $R_{ef}$, which configuration differs from that of the first embodiment, and therefore, an advantage arises in that an area of the memory cell array 1" is reduced. However, a distance between the reference cell $R_{ef}$ and each of the memory cells $C_{11}$ to $C_{1n}$ on which a read operation is performed with reference to the reference cell $R_{ef}$ becomes large, whereby the memory cell array of the third embodiment is more probably affected by variation due to the process variation in the manufacture of semiconductor memory device in comparison with the memory cell array of the first embodiment.

It should be appreciated that although the semiconductor memory device of the third embodiment employs a memory cell from which data is read by sensing a current utilizing TMR effect shown in FIG. 12, instead, the invented semiconductor memory device may employ another type of memory cell on which a read operation is performed by sensing a current. For example, the invented semiconductor memory device may employ a memory cell used in EEPROM instead of the above-described memory cell shown in FIG. 12. That is, a MOS transistor has a floating gate formed therein and a read operation is performed on the memory cell such that current flowing between a source and a drain varies depending on an amount of electrical charges accumulated in the floating gate and a difference in the amount of the current flowing therebetween is detected.

Additionally, the semiconductor memory device of the third embodiment may employ a DRAM memory cell comprised of one transistor and one capacitor to constitute each of the memory cells $C_{i1}$ to $C_{mn}$ and further, employ a reference cell comprised of one transistor and one capacitor and configured to have the same structure as that of each of the memory cells $C_{11}$ to $C_{mn}$ to constitute a reference cell $R_{ef}$. Moreover, the semiconductor memory device of the third embodiment may employ another memory cell on which a read operation is performed by detecting a difference in the magnitude of voltage. For example, a FRAM memory cell using a ferroelectric capacitor and comprised of one transistor and one capacitor and a reference cell configured to have the same structure as that of the FRAM memory cell may be employed. In those cases, instead of the sense amplifier 5, the sense amplifier 5' explained in the description of the second embodiment is used.

The present invention is able to provide a semiconductor memory device capable of suppressing influence of variation in electrical performance of memory cell and stably performing identification of data stored in a memory cell.

Furthermore, in addition to the capability to suppress influence of variation in electrical performance of memory cell and stably perform identification of data, the present invention is able to provide a semiconductor memory device that occupies a small area.

What is claimed is:

1. A nonvolatile memory device comprising:
   a reference cell;
   a first memory cell;
   a second memory cell located nearer said first memory cell than said reference cell; and
   a data read circuit for identifying first data stored in said first memory cell based on a reference cell electrical state of said reference cell and a first electrical state of said first memory cell, and identifying second data stored in said second memory cell based on said first electrical state and a second electrical state of said second memory cell.

2. The device as claimed in claim 1, wherein said data read circuit includes:
   a first comparator for outputting a first comparison result signal indicating reference cell storage data stored in said reference cell and said first data coincide with each other and are different from each other, based on said reference cell electrical state and said first electrical state;
   a first data reproduction circuit for reproducing said first data based on said reference cell storage data and said first comparison result signal;
   a second comparator for outputting a second comparison result signal indicating said first data and said second data coincide with each other and are different from each other, based on said first electrical state and said second electrical state; and
   a second data reproduction circuit for reproducing said second data based on said first data and said second comparison result signal.

3. The device as claimed in claim 1, wherein each of said reference cell, said first memory cell and said second memory cell includes a tunnel magneto-resistance effect element comprising:
   a first ferromagnetic thin film layer;
   a second ferromagnetic thin film layer; and
   a tunnel insulation film interposed between said first ferromagnetic thin film layer and said second ferromagnetic thin film layer.

4. The device as claimed in claim 1 further comprising one signal line, wherein each of said reference cell, said first memory cell and said second memory cell is enabled by one signal line.

5. The device as claimed in claim 1 further comprising:
   a third memory cell; and
   a fourth memory cell located nearer said third memory cell than said reference cell,
   wherein said read circuit identifies third data stored in said third memory cell based on said reference cell electrical state and a third electrical state of said third memory cell, and identifies fourth data stored in said fourth memory cell based on said third electrical state and a fourth electrical state of said fourth memory cell.

6. The device as claimed in claim 5 further comprising:
   a first signal line;
   a second signal line; and
   a third signal line,
   wherein said reference cell is enabled by said first signal line, said first memory cell and said second memory cell are enabled by said second signal line, and said third memory cell and said fourth memory cell are enabled by said third signal line.

7. A nonvolatile memory device comprising:
   a plurality of memory cells disposed in a matrix;
   a plurality of reference cells disposed in a column; and
   a data read circuit,
   said data read circuit being provided for identifying first data stored in a first memory cell in said plurality of memory cells, based on a reference cell electrical state of a reference cell in said plurality of reference cells and a first electrical state of said first memory cell arranged nearest to said reference cell, and identifying second data stored in a second memory cell in said plurality of memory cells, based on said first electrical state and a second electrical state of said second memory cell arranged nearest to said first memory cell.

8. The device as claimed in claim 7, wherein each of said reference cell, said first memory cell and said second memory cell is enabled by one signal line.

9. A nonvolatile memory device comprising:
   a memory cell array having therein a plurality of memory cells disposed in a matrix;
   a reference cell; and
   a data read circuit,
   said data read circuit identifying first data stored in a first memory cell located on an outermost periphery of said memory cell array based on a reference cell electrical state of said reference cell and a first electrical state of said first memory cell, and identifying second data stored in a second memory cell located adjacent to said first memory cell based on said first electrical state and a second electrical state of said second memory cell.

10. The device as claimed in claim 9, wherein
    said data read circuit identifies third data stored in a third memory cell located on an outermost periphery of said memory cell array and being different from said first memory cell based on said reference cell electrical state and a third electrical state of said third memory cell, and identifies fourth data stored in a fourth memory cell located adjacent to said third memory cell based on said third electrical state and a fourth electrical state of said fourth memory cell.

11. A method of reading data from a nonvolatile memory device, comprising:
    (a) identifying first data stored in a first memory cell based on a reference cell electrical state of a reference cell and a first electrical state of said first memory cell; and (b) identifying second data stored in a second memory cell located nearer said first memory cell than said reference cell based on said first electrical state and a second electrical state of said second memory cell.

12. The method as claimed in claim 11, wherein said step (a) includes:
(c) producing a first comparison result signal indicating reference cell storage data stored in said reference cell and said first data coincide with each other and are different from each other, based on said reference cell electrical state and said first electrical state; and
(d) reproducing said first data based on said reference cell storage data and said first comparison result signal,
and said step (b) includes:
(e) producing a second comparison result signal indicating said first data and said second data coincide with each other and are different from each other, based on said first electrical state and said second electrical state; and
(f) reproducing said second data based on said first data and said second comparison result signal.

13. A method of reading data from a nonvolatile memory device, comprising
selecting a reference magnetic memory cell, a first magnetic memory cell and a second magnetic memory cell;
comparing said reference magnetic memory cell and said first magnetic memory cell; and
comparing said first magnetic memory cell and said second magnetic memory cell.

14. The method as claimed in claim 13, further comprising:
producing a first comparison result by comparing said reference magnetic memory cell and said first magnetic memory cell;
detecting a first data stored in said first magnetic memory cell by comparing state readout from said reference magnetic memory cell and said first comparison result;
producing a second comparison result by comparing said first magnetic memory cell and said second magnetic memory cell; and
detecting a second data stored in said second magnetic memory cell by comparing said first data and said second comparison result.

15. The method as claimed in claim 14, wherein said reference magnetic memory cell is located adjacent to said first magnetic memory cell and said first magnetic memory cell is located adjacent to said second magnetic memory cell.

16. The method as claimed in claim 14, wherein said reference magnetic memory cell is selected by a reference bit line, said first magnetic memory cell is selected by a first bit line located adjacent to said reference bit line, and said second magnetic memory cell is selected by a second bit line located adjacent to said first bit line.

17. The method as claimed in claim 13, wherein said reference magnetic memory cell, said first magnetic memory cell and said second magnetic memory cell are selected at the same time by one word line.

18. The method as claimed in claim 13, wherein said reference magnetic memory cell is selected by a reference word line, said first magnetic memory cell and said second magnetic memory cell are selected at the same time by one word line.

19. A method of reading data from a nonvolatile memory device, comprising:
identifying data written into a first magnetic memory cell by comparing a first current flowing through a first line based on data written into said first magnetic memory cell and a current flowing through said a reference line based on data stored in said reference cell;
comparing a current flowing through a second line based on data written into a second memory cell and a current flowing through said first line based on data stored written into said first memory cell; and
identifying data written into said second memory cell based on a comparison result obtained by a step of identifying data written into said second memory cell and a result obtained by a step of identifying data written into said first memory cell.

20. The method as claimed in claim 19, wherein said reference cell is disposed adjacent to said first memory cell and said first memory cell is disposed adjacent to said second memory cell.

* * * * *